US009021296B1

(12) United States Patent
Kiselev et al.

(10) Patent No.: US 9,021,296 B1
(45) Date of Patent: Apr. 28, 2015

(54) INDEPENDENT DATA INTEGRITY AND REDUNDANCY RECOVERY IN A STORAGE SYSTEM

(71) Applicant: Hitachi Data Systems Engineering UK Limited, Berkshire (GB)

(72) Inventors: Oleg Kiselev, Palo Alto, CA (US); Gaurab Paul, Cupertino, CA (US); Christopher Youngworth, San Jose, CA (US)

(73) Assignee: Hitachi Data Systems Engineering UK Limited, Berkeshire (GB)

(*) Notice: Subject to any disclaimer, the term of this patent is extended or adjusted under 35 U.S.C. 154(b) by 0 days.

(21) Appl. No.: 14/583,900

(22) Filed: Dec. 29, 2014

Related U.S. Application Data

(63) Continuation of application No. PCT/US2013/065623, filed on Oct. 18, 2013.

(51) Int. Cl.
 *G06F 11/00* (2006.01)
 *G06F 11/20* (2006.01)
 *G06F 11/16* (2006.01)

(52) U.S. Cl.
 CPC ........ *G06F 11/2058* (2013.01); *G06F 11/2064* (2013.01); *G06F 2201/82* (2013.01); *G06F 11/2082* (2013.01); *G06F 11/1658* (2013.01)

(58) Field of Classification Search
 None
 See application file for complete search history.

(56) References Cited

U.S. PATENT DOCUMENTS

| | | | |
|---|---|---|---|
| 6,356,801 B1 | 3/2002 | Goodman et al. | |
| 6,401,215 B1 * | 6/2002 | Maddalozzo et al. | 714/6.11 |
| 6,907,507 B1 | 6/2005 | Kiselev et al. | |
| 6,910,098 B2 * | 6/2005 | LeCrone et al. | 711/112 |
| 6,910,111 B1 | 6/2005 | Colgrove et al. | |
| 6,978,354 B1 | 12/2005 | Kekre et al. | |
| 7,089,385 B1 | 8/2006 | Kiselev et al. | |
| 7,222,257 B1 * | 5/2007 | Dibb | 714/6.21 |
| 7,392,421 B1 * | 6/2008 | Bloomstein et al. | 714/4.4 |
| 7,617,259 B1 | 11/2009 | Muth et al. | |
| 7,805,407 B1 * | 9/2010 | Verbeke et al. | 707/634 |
| 8,401,997 B1 | 3/2013 | Tawri et al. | |
| 8,498,967 B1 * | 7/2013 | Chatterjee et al. | 707/674 |
| 8,549,187 B1 | 10/2013 | Christopher et al. | |
| 8,689,043 B1 * | 4/2014 | Bezbaruah et al. | 714/6.3 |
| 2002/0103663 A1 | 8/2002 | Bankier et al. | |
| 2003/0050966 A1 | 3/2003 | Dutta et al. | |
| 2003/0145179 A1 * | 7/2003 | Gabber et al. | 711/162 |

(Continued)

OTHER PUBLICATIONS

International Search Report and Written Opinion, dated Jan. 29, 2015 for International Patent Application No. PCT/US2013/065623.

(Continued)

*Primary Examiner* — Gabriel Chu
(74) *Attorney, Agent, or Firm* — Mattingly & Malur, P.C.

(57) ABSTRACT

A storage system includes a plurality of nodes connected to a network. Each node is capable of performing its own recovery of partially written data and maintaining consistency of the data stored on the storage system. The nodes may independently calculate the location of the data across the nodes and independently balance the data, maintain consistency based on a redundancy policy of the storage system, and migrate data according to a location change. If a node determines that the stored data thereon is incomplete or damaged, the node may reconstruct its respective data from replica data on other nodes. During migration of data between the nodes, I/O processing from a host is not interrupted in some examples.

24 Claims, 21 Drawing Sheets

(56) References Cited

U.S. PATENT DOCUMENTS

| | | | |
|---|---|---|---|
| 2003/0237019 A1* | 12/2003 | Kleiman et al. | 714/6 |
| 2004/0003111 A1 | 1/2004 | Maeda et al. | |
| 2004/0064568 A1 | 4/2004 | Arora et al. | |
| 2004/0098447 A1 | 5/2004 | Verbeke et al. | |
| 2004/0260761 A1 | 12/2004 | Leaute et al. | |
| 2004/0260976 A1* | 12/2004 | Ji et al. | 714/31 |
| 2005/0080858 A1 | 4/2005 | Pessach | |
| 2005/0108368 A1 | 5/2005 | Mohan et al. | |
| 2005/0251633 A1* | 11/2005 | Micka et al. | 711/162 |
| 2005/0278483 A1 | 12/2005 | Andruszkiewicz et al. | |
| 2007/0198710 A1 | 8/2007 | Gopalakrishnan | |
| 2007/0244894 A1 | 10/2007 | St. Jacques | |
| 2008/0008179 A1 | 1/2008 | Chen et al. | |
| 2008/0019365 A1 | 1/2008 | Tripathi et al. | |
| 2009/0006744 A1* | 1/2009 | Cavallo et al. | 711/114 |
| 2009/0276543 A1 | 11/2009 | Turner et al. | |
| 2010/0329268 A1 | 12/2010 | Hautakorpi et al. | |
| 2010/0333094 A1 | 12/2010 | Restall et al. | |
| 2011/0072075 A1 | 3/2011 | Gautier | |
| 2011/0087731 A1 | 4/2011 | Wong et al. | |
| 2011/0099351 A1 | 4/2011 | Condict | |
| 2011/0225297 A1 | 9/2011 | Archer et al. | |
| 2012/0110057 A1 | 5/2012 | Hautakorpi et al. | |
| 2012/0197962 A1 | 8/2012 | Maenpaa et al. | |
| 2013/0046811 A1 | 2/2013 | Park et al. | |
| 2013/0061232 A1 | 3/2013 | Bernbo et al. | |
| 2013/0151663 A1 | 6/2013 | He et al. | |
| 2013/0315240 A1 | 11/2013 | Kobayashi | |
| 2014/0218248 A1 | 8/2014 | Schulz et al. | |

OTHER PUBLICATIONS

Chandrasekar et al., "A Novel Indexing Scheme for Efficient Handling of Small Files in Hadoop Distributed File System", 2013 International Conference on Computer Communication and Informatics, Jan. 4, 2013, pp. 1-8.

Feller et al., "Snooze: A Scalable and Automatic Virtual Machine Management Framework for Private Clouds", 2012 12th IEEE/ACM International Symposium on Cluster, Cloud and Grid Computing, May 13, 2012, pp. 482-489.

Xu et al., "A Cloud Computing Platform Based on P2P", IT in Medicine & Education, 2009. ITIME '09. IEEE International Symposium on, Aug. 14, 2009, pp. 427-432.

International Search Report and Written Opinion, dated Apr. 29, 2014 for International Patent Application No. PCT/IB2013/001931.

Weil; Scott A. Brandt; Ethan L Miller; Carlos Maltzahn; , "CRUSH: Controlled, Scalable, Decentralized Placement of Replicated Data," Proceedings of the 2006 ACM/IEEE Conference on Supercomputing, Nov. 2006, 12 pages.

Leslie Lamport, "Paxos Made Simple", ACM SIGACT News, (Nov. 2001) 11 pages.

Tushar Deepak Chandra, Robert Griesemer, and Joshua Redstone, "Paxos Made Live—An Engineering Perspective (2006 Invited Talk)", Proceedings of the 26th Annual ACM Symposium on Principles of Distributed Computing, ACM press (Jun. 2007) 16 pages.

* cited by examiner

DISK LIST

| CGID | 1 |
|---|---|
| OLD | 1A, 3C, 4F |
| NEW | 2B, 3C, 5A |

77 points to CGID row; 76 points to OLD and NEW rows — GENERATED BY CRUSH

| NODE # | NODE STATUS | DISK | DISK STATUS |
|---|---|---|---|
| 1 | 1 | A | 1 |
|   |   | B | 1 |
|   |   | C | 1 |
| 2 | 1 | A | 1 |
|   |   | B | 0 |
|   |   | C | 1 |
|   |   | D | 0 |
|   |   | E | 0 |
|   |   | F | 1 |
|   |   | G | 1 |

FIG. 6

NODE 1

| EVENT # | EVENT |
|---|---|
| 1 | MAP_CHANGE_PROPOSAL |
| 2 | MAP_MIGRATE |
| ⋮ | |
| n | MAP_COMMIT |

FLAG TABLE

| | CHUNK 1 | | CHUNK 2 | | |
|---|---|---|---|---|---|
| | STATUS | EVENT NO. AFTER DEGRADED FLAG OR WRITE | STATUS | EVENT NO. AFTER DEGRADED FLAG OR WRITE | ~120 |
| CLEAN | 0 | | 1 | | |
| DIRTY | 1 | | 0 | | |
| DEGRADED | 1 | 3 | 1 | 2 | |
| WRITE | | 2 | | 1 | |

FIG. 12

CHUNK STUB MANAGEMENT INFORMATION

| | | 105 |
|---|---|---|
| 106 — CHUNK NO. | 8 | |
| 107 — CG ID | 4 | |
| 108 — OLD MAP LOCATION | 2A | |
| 109 — RECOVERY_READ REQUEST SENT | 0 | |
| 110 — ALL SLICES COPIED | 0 | |
| 111 — I/O KEY LIST EMPTY | 0 | |

BITMAP

SLICE  CHUNK NO. 1
1  011
2  100
3  101
4  000
5  010
⋮
n  011

FIG. 14

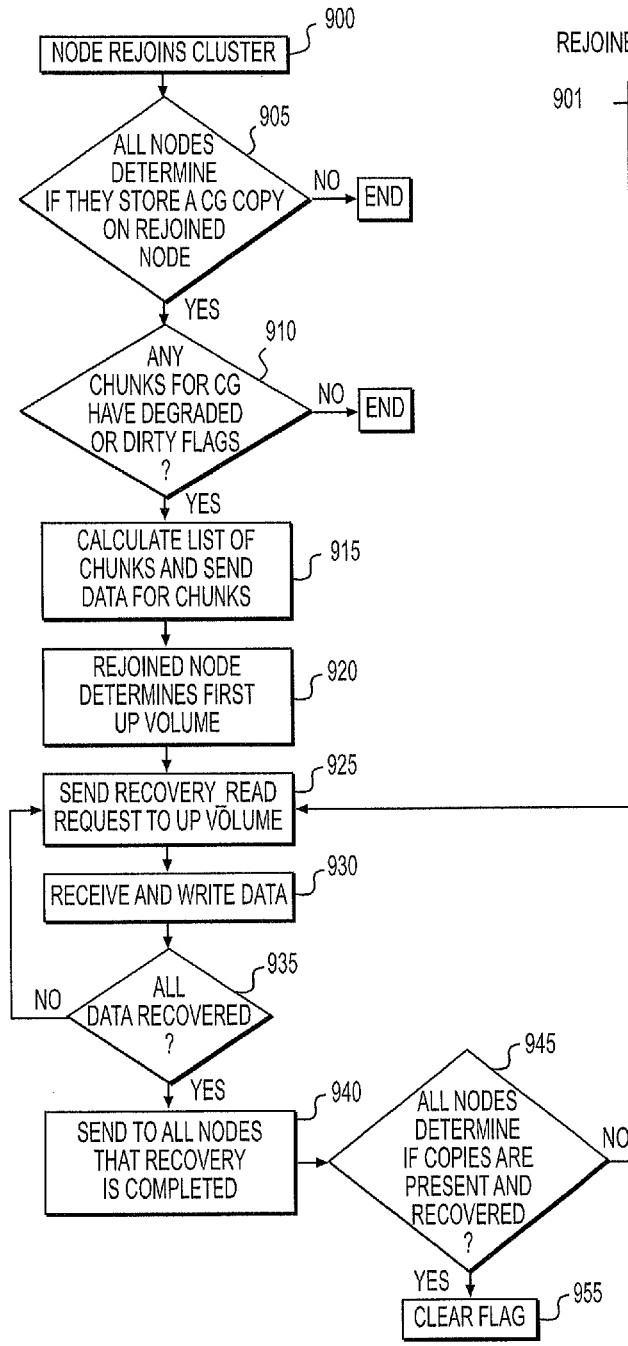
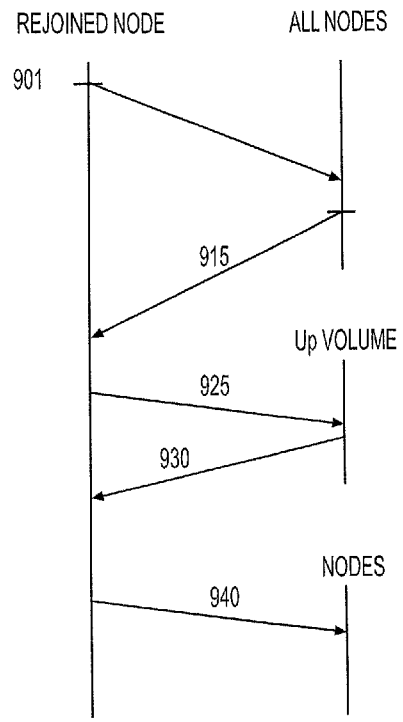
FIG. 25
FIG. 24

INDEPENDENT DATA INTEGRITY AND REDUNDANCY RECOVERY IN A STORAGE SYSTEM

CROSS-REFERENCE TO RELATED APPLICATION

This application claims priority from PCT Application No. PCT/US2013/065623, filed on Oct. 18, 2013, which is incorporated herein by reference.

BACKGROUND

1. Field of the Invention

The present invention relates to a shared-nothing distributed storage system that consists of a cluster of independent computer systems (nodes) connected by a network.

2. Description of the Related Art

The data stored in a storage system must be reliably maintained and input/output (I/O) processing must not be interrupted during migration of the data in the storage system. For a write operation, for example, during migration, the storage system must reliably track the data object state.

One known method employs write marking where a region of data that is to be modified is marked, for example with a "dirty" flag, on a common/shared "scoreboard" before writing the data. In this approach, several steps are required which include logging a request to write data, sending a message to each target storing the data, waiting for a write and a response, then sending the actual write operation. The foregoing method leads to increases in network latency for write operations.

Another known storage method marks an entire high level data storage area as dirty. However, such an approach is not viable with respect to large amounts of data because it requires recovery of the entire large aggregations of data. Known storage systems may also mark a file as dirty at the file system level to indicate a modification. However, marking at the file system level results in the marked data having a granularity that is too coarse to be effective for very large data files, which results in recoveries which require too long a period of time to complete. Still further, marking a chunk of data as dirty in a centralized database is also known in the art, such as in Parascale Inc.'s scale-out storage platform software.

Similar functions in known storage systems further include the Fast Mirror Resync (FMR) feature of VERITAS Volume Manager (VxVM), which is described in U.S. Pat. Nos. 6,907,507, 6,910,111, 7,089,385 and 6,978,354, for example, which are incorporated herein by reference. U.S. Pat. Nos. 6,907,507, 6,910,111, 7,089,385 and 6,978,354 use multi-column bitmaps, accumulator maps and per-mirror maps. With respect to recovery from I/O errors, storage systems of the prior art (volume managers and multi-copy file systems) require a central manager to either perform recovery by directly reading or writing data, or require a coordinator to manage the recovery process. A drawback of such a configuration is that centrally-managed recoveries stall when the coordinator undergoes a failure, which leads to further complications in the recovery process. Additionally, to account for the possibility of coordinator failure, large amounts of metadata are required to be reliably maintained in a shared storage.

In cases of partially written data recovery, the prior art consists of mirror reconnection and mirror "resilvering" approaches taken by many volume manager implementations, which use a central database or volume-level bitmap of some sort. Other implementations use a central recovery manager that does direct reads and writes from one central location (all volume managers) or have a central coordinator to drive the recovery (as in Parascale Inc.'s scale-out storage platform software, for example).

In cases involving the migration of data, where a node or a disk thereof is added or removed in a storage system, the prior art includes the CEPH file system relayout feature, which is based on reliable hashes and map generations. Both PIC-ASSO and CEPH systems use a placement algorithm commonly known as the "CRUSH" algorithm to deterministically calculate the proper placement of data chunks based on version information of the storage configuration across an entire storage cluster. See Sage A. Weil; Scott A. Brandt; Ethan L. Miller; Carlos Maltzahn;, "CRUSH: Controlled, Scalable, Decentralized Placement of Replicated Data," Proceedings of the 2006 ACM/IEEE Conference on Supercomputing, p. 31, 2006, which is incorporated herein by reference. In the CEPH system, relayout is performed by a central metadata engine. Further, in the Parascale system data relayout is driven by a central database and placement is done in an ad-hoc, per-chunk manner. When relayout in the Parascale system is interrupted, the data layout is left in a transitional but consistent state and upon resuming of the relayout process, data placement is recalculated.

In cases where a policy change is made to data redundancy, data movement is centrally administered and is performed from a central management node. The Parascale Inc.'s system had a central administration of migration, where locations determined as new data locations are required to "pull" data from existing storage locations to satisfy the change in redundancy.

SUMMARY

Embodiments of the present invention generally relate to computer systems and corresponding methods of controlling said computer systems, and more specifically to techniques for data management and migration in a shared-nothing distributed storage system. The following embodiments that are described below are exemplary and of a nature such that those skilled in the art will appreciate that the invention may be practiced with other modifications, alternative constructions and equivalents which fall within the spirit and scope of the invention, and also that one or more embodiments of the present invention may be combined together.

In one embodiment, a method of maintaining data integrity and redundancy, and recovery of data integrity and redundancy in a shared-nothing distributed storage system is provided. In a shared-nothing distributed storage system, the storage system includes a plurality of independent systems (herein referred to as nodes) which are interconnected to form a storage system (herein referred to as a cluster). Each node of the cluster handles the management of namespace, metadata, and location information of files. Further, each node is provided with a storage area which is independent of other nodes in the cluster and is responsible for the physical storage and access to files stored in one or more file systems of the cluster. Since each storage node is provided with one or more persistent storage devices, whether local or attached through a storage area network (SAN) and the like, and under normal circumstances each node can access only its own storage devices, and in general a node cannot access other nodes' storage devices, and the whole system's storage is thus distributed among the system's nodes, this cluster architecture is referred to as a shared-nothing distributed storage system.

Data can be distributed across the storage devices in the cluster using an algorithm that takes into account storage status and cluster-wide activity information, or using some other mapping function. In the exemplary embodiment, a pseudo-random, consistent hash (CRUSH algorithm) is used, which determines the placement of data within the cluster using the topology and loading factors of storage in the cluster and using a unique "key" associated with the data to calculate the locations where the data will be placed. In the exemplary embodiment data is mapped to discrete, finite size containers (herein referred to as "chunks"). These chunks are placed by applying the CRUSH algorithm to some unique attribute of the chunk or groups of chunks.

To provide resiliency against node and storage failures, data is stored redundantly. Copies of data or erasure-coded fragments of data are distributed to multiple locations in the cluster in such a way that data can remain accessible and recoverable when a subset of nodes or storage devices fail. A variety of techniques exist for recoverable redundant placement of data. The exemplary embodiment exploits the feature of the CRUSH algorithm, where the CRUSH algorithm will calculate a set of locations that are pseudo-randomly distributed across the cluster, constrained to avoid placement of multiple copies of data on the same storage device or node. Tracking object placement and object metadata on a per-object basis places a large processing load on the cluster. For example, a storage system with billions of objects encounters unreasonable loads when tracking placement on a per-object basis. In the exemplary embodiment the chunks are aggregated into larger logical groups (herein referred to as "consistency groups" or "CG"s), where locations for placement of all chunks in a CG is calculated using the same unique attribute. In the exemplary embodiment CGs are placed by applying the CRUSH algorithm to a CG's "name". CGs address the foregoing problem by tracking data as aggregations of a plurality of objects and further provides the added benefit that aggregated data is redundantly stored within the cluster. Moreover, consistency groups have the benefit of reducing the amount of computations and the amount of per-object metadata the system must track when storing and retrieving data. For example, the metadata may include one or more pieces of information relating to file attributes, such as file name, ID, permissions, size, type, information pertaining to when the data was created (creation time), event number after which the data was written, event number after which flags used to denote a state of data are set, access time of the data and the like.

In some other embodiments, storage devices are attached locally to each node and are not accessible by other nodes in the cluster. Further, data processing is locally available to each node and is not accessible by other nodes in the cluster. Data stored in such a storage system is replicated between nodes to provide data availability and resiliency in cases of a failure of one or more of the nodes or a failure of storage locally attached to one of the nodes. The data stored anywhere in the cluster is accessible from anywhere else in the cluster via inter-node communication connections and data location and data access mechanics are invisible to the clients that create, modify and read the data stored on the cluster.

In some embodiments, the local storage area of each node is configured as an intelligent object storage (referred to herein as Object-based Storage Device or OSD, but not conforming to the SNIA and T10 OSD standard). OSD is similar to disk storage but provides a more abstracted view of the storage space. Instead of processing reads and writes as fixed sized blocks of data, an OSD organizes data into object data containers. Each object has both data and metadata such as attribute information describing the object.

In some embodiments, when an occurrence such as a node or disk failure happens in the cluster, the system must repair affected data items. For example, in the case of recovery, each node subject to a recovery process is charged with management of its own recovery. Recovery is accomplished through reliable tracking of data modification operations, having all nodes informed of the storage cluster and data states therein, and independently determining if recovery operations must be performed on local data and what such operations entail. In some other embodiments, if the configuration of the cluster changes because disks or nodes have been added or removed, data may need to be rebalanced or relocated to take advantage of new storage capacity or to adapt to storage capacity being reduced. In still other embodiments, if a redundancy policy changes, for example by increasing the number of copies of data that must be stored, new data copies must be created. Such occurrences are grouped under a category referred to herein as "recovery". One object of the present invention is to provide fast, efficient and reliable recovery because additional failures within the cluster may result in data loss and by performing timely and efficient recovery of data, the probability of data loss due to additional failures can be significantly reduced.

In other embodiments, data object states are reliably tracked in accordance with in-progress writes and writes to data objects that are missing copies; recovering from I/O errors resulting from writes to synchronously replicated data by using a "pull" approach from the affected node, instead of a "push" approach where a "good" node writes to a "broken" one; recovering from partial writes to synchronously replicated data caused by failure of the writer without creating a global state dependency chain; migrating data in cases where storage and/or nodes are added or removed; and adding and/or removing redundant copies of synchronously replicated data when a data redundancy policy changes.

In yet other embodiments, a distributed consensus algorithm is implemented in the cluster to coordinate events and processing among the nodes. An example of a consensus algorithm is the Paxos family of algorithms, which are known in the art. In a Paxos algorithm, any of the nodes can act as a "leader" and seek to propose a command for execution by every node in the system. Every such proposal can be sent with a corresponding proposal number to more easily track the proposals. Such proposal numbers need not bear any relation to the particular step for which the nodes are attempting to agree upon a command to perform. Initially, the leader can suggest a proposal number for a proposal the leader intends to submit. Each of the remaining devices can then respond to the leaders suggestion of a proposal number with an indication of the last proposal they voted for, or an indication that they have not voted for any proposals. If, through the various responses, the leader does not learn of any other proposals that were voted for by the devices, the leader can propose that a given client command be executed by the devices, using the proposal number suggested in the earlier message. Each device can, at that stage, determine whether to vote for the action or reject it. A device should only reject an action if it has responded to another leader's suggestion of a higher proposal number. If a sufficient number of devices, known as a quorum, vote for the proposal, the proposed action is said to have been agreed upon, and each device performs the action and can transmit the results. In such a manner, Paxos algorithms allow each of the devices to perform actions in the same order, maintaining the same state among all of the nodes.

In general, the Paxos algorithms can be thought of in two phases, with an initial phase that allows a leader to learn of prior proposals that were voted on by the devices, as described above, and a second phase in which the leader can propose client commands for execution. Once the leader has learned of prior proposals, it need not repeat the first phase. Instead, the leader can continually repeat the second phase, proposing a series of client commands that can be executed by the distributed computing system in multiple steps. In such a manner, while each client command performed by the distributed computing system for each step can be thought of as one instance of the Paxos algorithm, the leader need not wait for the devices to vote on a proposed client command for a given step before proposing another client command for the next step.

In some of the embodiments, a Paxos algorithm is used to ensure that each node in the cluster is processing data in the proper order, and that each node maintains the same state. In this manner, individual nodes following a Paxos algorithm may fail, but no operations will be lost within the cluster during the failure. In the embodiments implementing Paxos algorithms, any of the individual nodes can act as a leader and seek to propose an operation for execution to every other node in the cluster. By requiring that every node execute the same commands in the same order, the Paxos algorithm achieves synchronization among the nodes of the cluster. Additionally, if a node in the cluster fails or otherwise crashes, the cluster is informed using a Paxos message. See "Paxos Made Simple", by Leslie Lamport. ACM SIGACT News (Distributed Computing Column) 32, 4 (Whole Number 121, December 2001) 51-58, which is herein incorporated by reference. See also "Paxos Made Live—An Engineering Perspective (2006 Invited Talk)", by Tushar Deepak Chandra, Robert Griesemer, and Joshua Redstone. Proceedings of the 26th Annual ACM Symposium on Principles of Distributed Computing, ACM press (2007), which is herein incorporated by reference.

BRIEF DESCRIPTION OF THE DRAWINGS

FIG. 5 illustrates an example of disk lists generated by CRUSH according to one embodiment of the present invention.

FIG. 6 illustrates an example of state information of all the nodes of a cluster according to one embodiment of the present invention.

FIG. 8 illustrates an example of an event list that each node stores according to one embodiment of the present invention.

FIG. 12 illustrates an example of a flag table according to one embodiment of the present invention.

FIG. 13 illustrates an example of chunk stub management information according to one embodiment of the present invention.

FIG. 14 illustrates an example of a bitmap stored in the memory of a node according to one embodiment of the present invention.

FIG. 24 illustrates a flow chart of the process of recovery of a node of partially written data after rejoining the cluster according to one embodiment of the present invention.

FIG. 25 illustrates a message sequence of the process of recovery of a node of partially written data after rejoining the cluster according to one embodiment of the present invention.

DETAILED DESCRIPTION OF THE INVENTION

Figure 1:
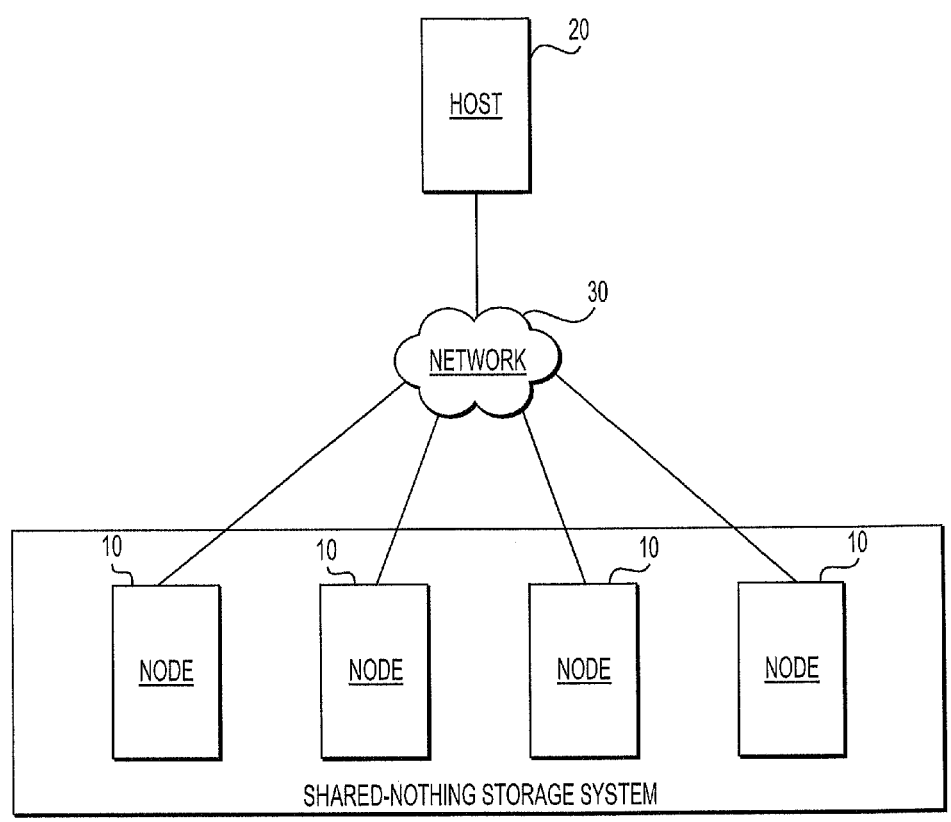
FIG. 1 is an illustration of a clustered shared-nothing storage system according to one embodiment of the present invention.

The embodiments discussed herein are illustrative of one or more examples of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the scope of the present invention. Hence, the present descriptions and drawings should not be considered in a limiting sense, as it is understood that the present invention is in no way limited to only the embodiments illustrated herein. Unless otherwise indicated, like parts and method steps are referred to with like reference numerals.

INTRODUCTION

This invention can be implemented as the architectural foundation of a network attached storage (NAS) system and can be used in any distributed data platform. In general, a shared-nothing distributed storage system is provided that distributes and stores data objects in a file system on nodes 10 connected to a network 30 as shown in FIG. 1.

Figure 2:
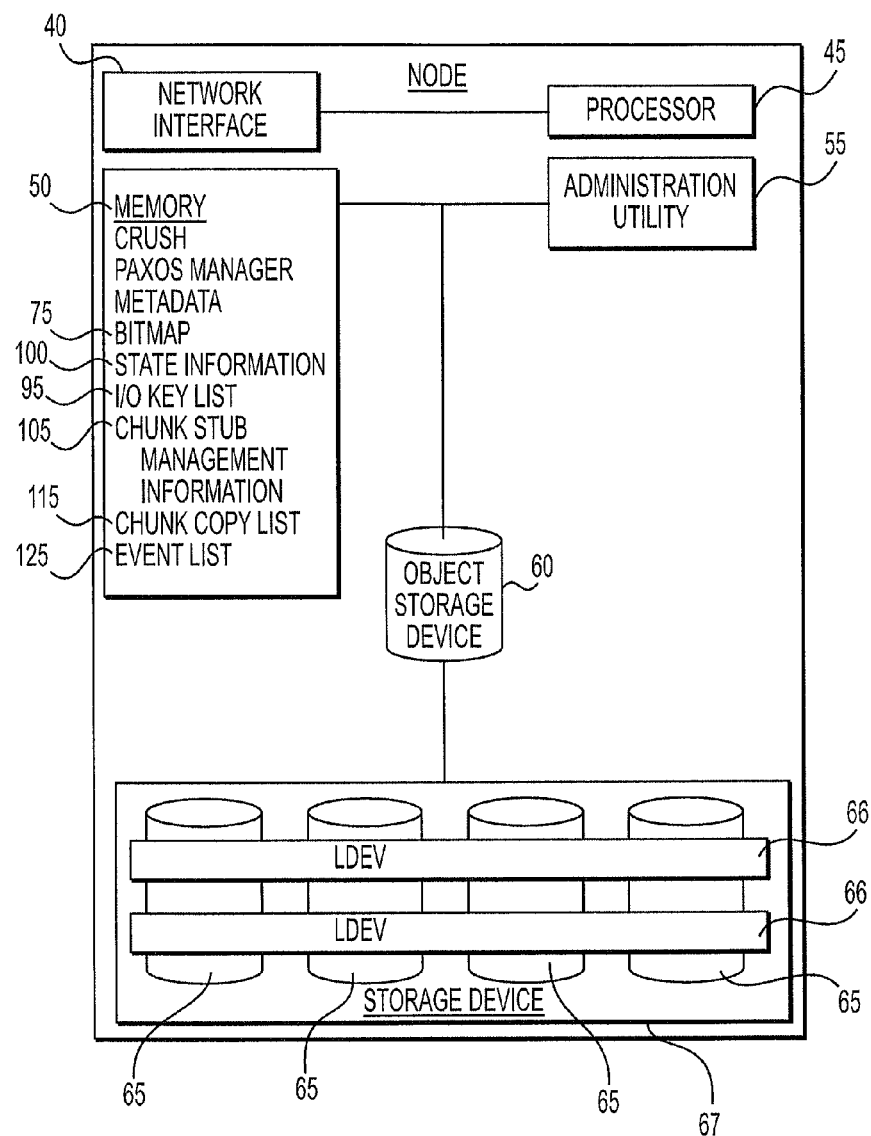
FIG. 2 is a block diagram of a node according to one embodiment of the present invention.

As shown in FIG. 1, each node 10 of a cluster is connected through a network 30. One or a plurality of clients or hosts 20 are coupled to the shared-nothing storage system. The host 20 is generally a computer, but may also be another storage system or sever connected over via a network. The host 20, for example, transmits an I/O operation to the storage system. The I/O operation is, for example, a write operation (WRITE), read operation (READ), remove operation (REMOVE), or truncate (TRUCATE) operation. An I/O operation that modifies chunk data (such is a WRITE) supplies a globally-unique key to nodes that store that chunk. As shown in FIG. 2, each node 10 keeps an I/O key list 95 in memory 50, which keeps the I/O keys for each chunk it stores. Additionally, if an I/O operation is requested to a node 10 that is down, the node 10 will receive the I/O operation when the node 10 comes back online by querying other nodes in the cluster for their up-to-date I/O key list. An active node 10 or disk 65 is herein referred to as online, whereas an inactive node 10 or disk 65 is herein referred to as offline. Any of the nodes 10 can be manually taken offline or online as needed, or they may go offline because of a software or hardware fault.

Typically, hosts 20 are computer systems such as personal computers (PCs), workstations, laptops, personal digital assistants (PDAs), servers, mainframes, and the like. The hosts 20 are configured to access remote files and file systems using file access protocols, such as NFS, CIFS, HTTP, FTP, and the like.

The nodes 10 may be PCs, workstations, servers, mainframes, and the like; or they may be storage devices with sufficient embedded computing capabilities to implement the system described here, such as disk arrays or storage appliances. The nodes may store information associated with files in a file system on a local file system, network attached storage (NAS), a storage area network (SAN), a database, and the like. Further, the nodes may be configured from any hardware and/or software elements to store files in a file system and may implement one or more file systems to store files, such as NTFS, EXT, XFS, GFS, and the like.

In the cluster, the file system itself may span one or more nodes or the entire cluster, as it is not physically tied to a particular node. Data is stored on the nodes 10 and is accessible by other nodes 10 in the cluster via inter-node communication connections. Technical aspects of the network interface 40 and underlying network communications are not within the scope of this invention and therefore those aspects are not explained in detail. During migration of data between the nodes 10 in the cluster, I/O processing from the host 20 is not interrupted.

The data stored on the nodes 10 in the storage system is replicated between the nodes 10 to provide data availability and resiliency in case of a failure of one or more of the nodes 10 or failure of a disk 65 attached to a node 10. All nodes 10 are informed of the status of other nodes 10 and the state of the data on its disks 65 and disks 65 of the other nodes 10 via state information 100. An erasure-coding method may be employed in the storage system. For example, in a Reed-Solomon scheme, a calculation on blocks of data produces erasure-coded blocks. Numerous other suitable redundant or erasure-coded storage schemes will be apparent to one of ordinary skill in the art. Each node 10 may have both processing and storage capabilities. The nodes 10 in the cluster may store information associated with files in a file system on a local file system, NAS, a SAN, a database and the like. Nodes 10 may be added or removed from the cluster and disks 65 on the nodes 10 may be added or removed in order to scale capacity and bandwidth for serving files stored in the cluster.

Figure 4:
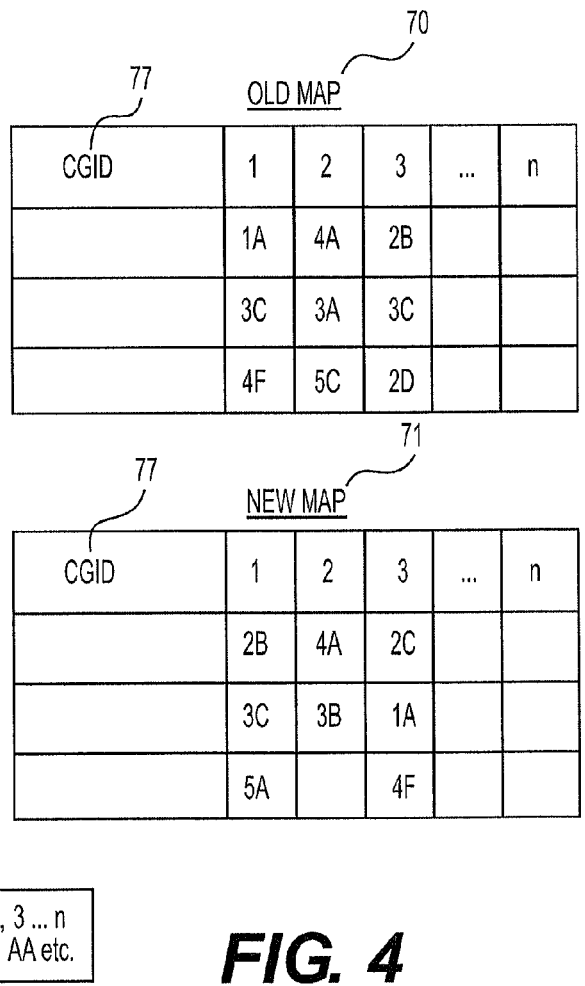
FIG. 4 illustrates an example of a storage configuration map for determining placement of data objects on the shared-nothing storage system according to one embodiment of the present invention.

A storage configuration map 70, 71 is utilized by all nodes 10 for determining a layout for distributed storage of the data on the storage system across the cluster of nodes 10 as in FIG. 4. When nodes 10 or disks 65 are added, for example, a map change proposal process is initiated in order to commit a new map 71 based on the addition of nodes or disks in the cluster. Based on the old and new maps 70, 71, each node 10 is aware of the placement or location of each data object. Both the old map 70 and the new map 71 are available for I/O processing and for layout reference in the nodes 10.

A map 70, 71 as shown in FIG. 4 is a collection of nodes 10 and disks 65 or volumes from which the CRUSH algorithm determines the placement of chunks of data, based on consistency group IDs (CGIDs 77). The storage system provides one or more logical storage areas or logical volumes configured using logical devices (LDEV) 66 shown in FIG. 2. A storage device 67 manages the correspondence (relation) between a logical volume and the LDEV 66. Volumes on a disk 65 or logical drives may be provided as locations for the chunks of a CG on the map 70, 71. Accordingly, the placement or location of given CGs chunks in the map 70, 71 may also be defined using the volumes or logical volumes instead of disks 65.

Figure 3:
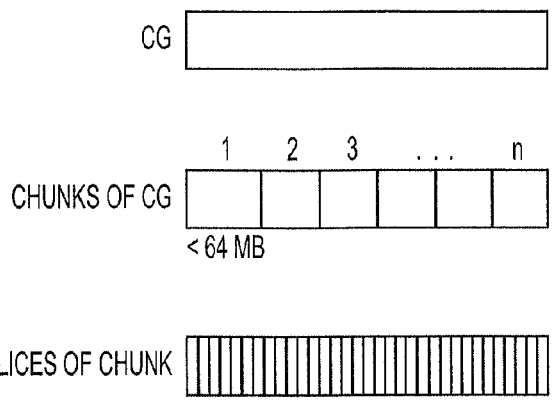
FIG. 3 illustrates, in a block diagram, the relationship between a consistency group, chunks, and slices according to one embodiment of the present invention.

Each CG has a unique identifier, CGID 77, that identifies a CG. Upon creation of a CG, the creating node 10 creates a CGID 77 for the CG created. The map 70, 71 is utilized in determining a layout for distributive storage of the data objects on the data storage system. CRUSH selects the placement of the CG and the storage objects it contains within the cluster based on the map 70, 71, of nodes 10 and disks 65. A CG is a group of data objects such as files, which consist of data chunks that share a CGID 77, and thus have the same placement on nodes 10 and disks 65. A data object is data of a finite length that is separately identifiable from other data objects and is transferable to the storage system and may be a text file, an image file, or a program file, or the like. CGs and their corresponding replicas are stored across multiple nodes 10 in the cluster. FIG. 3 shows an illustration of the relationship between a CG, a chunk, and a slice. As shown in FIG. 3, CGs consist of multiple chunks and each chunk is a data region of limited maximum size (e.g., 64 MB). Chunks are stored in multiple copies or are erasure-coded across nodes 10 for reliability. Each chunk may be further divided into regions of data called slices. Each slice may be of a fixed size.

The CRUSH algorithm can be used to produce a list of disks 65 on which data is stored from the map 70, 71. Any node 10 is capable of executing the CRUSH algorithm. A node 10 passes to the CRUSH algorithm information including a CGID 77 and a number of required unique placement locations. CRUSH responds with an explicitly ordered list of disks 65, for example. CRUSH guarantees that the same sequence of disks 65 are produced every time for the same CGID 77 within the same map 70, 71. That is, CRUSH may return a disk list 76 of 3 disks {A, B, C} or 4 disks, which produces a disk list 76 {A, B, C, D}. Disks 65 in the list 76 may be accessible or they may be inaccessible due to a software or hardware issue, for example a crash of node 10 to which a particular disk 65 is physically attached. The first usable disk 65 in the list 76 produced by crash can be referred to as the "first up" disk (volume).

FIG. 4 shows an example of an old map 70 and a new map 71. An old map 70 is a set of nodes 10 and disks 65 (volumes) that comprise the CRUSH map for the previous map 70 version. Whereas a new map 71 can be defined as a set of nodes 10 and volumes 65 that comprise the CRUSH map for a proposed new map 71 version. The old map 70 is used as the layout configuration of the data objects until the new map 71 is committed by the nodes 10. In other words, the map 70 corresponds to the current map used for placement of data in the cluster, whereas the map 71 is a new proposed placement of the data in the cluster. As denoted in the key of FIG. 4, the nodes 10 are denoted using node identifiers, for example, the numbers 1, 2, 3, 4, and the disks 65 are denoted using the capital letters, A, B, C, D, E . . . . Each disk 65 is identified by the pair (node number, disk letter). For example, 1A represents disk A on node 1.

FIG. 5 shows an exemplary disk list 76 generated by CRUSH using the old map 70 and the new map 71 for a CGID 77 "1". As shown in FIGS. 4 and 5, the disk list 76 under the old map 70 for CGID 77 "1" includes 1A, 3C, and 4F. Whereas, under the new map 71, CGID 77 "1" is stored on disks 2B, 3C, and 5A. Under the proposed (new) map 71, the disk list 76 generated by CRUSH for CGID 77 "1" includes 2B, 3C, and 5A.

The nodes 10 store metadata associated with the data in a filesystem, network attached storage (NAS), a storage area network (SAN), a database or the like. Metadata includes file attributes, such as file name, ID, permissions, size, type, information pertaining to when the data was created (creation time), event number after which the data was written, event number after which flags used to denote a state of data are set, access time of the data and the like. As shown in FIG. 2, each node 10 has an object storage device (OSD) 60, network interface 40, processor 45, administration utility (referred to herein as SA) 55, memory 50, and multiple disks 65. The network interface 40 communicates with the host and other nodes on the network and is responsible for receiving and responding to I/O processing from the host 20. Additionally, Paxos and the CRUSH algorithm, the maps 70, 71, metadata and bitmaps 75 may be configured and managed in the memory 50.

The memory on each node is used to perform the CRUSH and Paxos algorithms as well as store and manage information related to metadata of each CG and its chunks, flag table 120, I/O key list 95, state information 100, bitmaps 75, chunk stub management information 105, event list 125, and the chunk copy list 115.

Each node 10 has independent storage devices 67. The storage device 67 includes a plurality of storage drives or disks 65. Each disk 65 is, for example, a hard disk drive, semiconductor storage device (SSD) or the like of a type such as SAS (Serial Attached SCSI), SATA (Serial ATA), FC (Fibre Channel), PATA (Parallel ATA), and SCSI; or storage devices presented as SCSI Logical Units (LUNs) accessed remotely via a Storage Area Network (SAN) over a Fibre Channel network, or iSCSI LUNs accessed over TCP/IP network; or other persistent storage devices and mechanisms.

Each node 10 has an administration utility which provides a storage access layer (SA 55), which is the layer the host 20 communicates with to perform I/O. SA handles mirroring and consistency of the storage. The SA is the "initiator" part of the distributed I/O system. Additionally, the SA 55 is capable of requesting data from the OSD of each node 10. The OSD 60 of each node 10 handles local I/O on the node 10 and performs operations on the storage device 67. The OSD 60 performs communication with the storage device 67 when reading data from the storage device 67 or writing data to the storage device 67, for example. The OSD 60 is capable of determining, for a CG, which disks 65 it stores the CG's chunks on. Maps 70, 71 are created in the SA 55 of each node 10. Every node 10 is also aware of a map migration state, which indicates, whether migration is currently being executed. A CG is marked with a state indication that informs the system if that CG itself is in the process of being recovered or whether the CG is in a migration state. Additionally, the SA 55 manages the maps 70, 71. The SA 55 layer uses the map 70, 71, whether the map 70, 71 is an old map 70 or a new map (proposed map) 71.

Each node 10 provides state information 100 over the network that is received by the other nodes 10 and used to build and maintain individual views of the cluster of nodes 10. FIG. 6 is an example of state (status) information 100 of nodes and the disks thereof, which includes information about whether a node in the cluster 10 is active and whether the disks thereof are available for storage of data. Additionally, the state information 100 includes the availability of individual disks 65 in each locally attached storage device 67. Those having ordinary skill in the art realize that state information 100 may include different attributes or may be differently defined, such as an updating status or error status. In the example shown in FIG. 6, node 1 is online and disks A-C are online, whereas disks B, D and E of node 2 are offline. The state information 100 is dynamic and stored in memory of each node.

When an additional storage capacity, such as a disk 65 on a node 10 or a new node 10, is added to the cluster, when storage capacity is reduced, such as removal of a disk 65 or a node 10 is removed (causing all disks 65 attached to the given node 10 to go offline), or when disk weighting factors are changed to divert allocations away from heavily loaded nodes 10 or disks 65 to underutilized nodes, a map change must take place so the I/O processing for the cluster is performed according to the new map 71 to reflect the changes to the cluster configuration. Map changes will cause some CGs to get mapped to new locations (nodes 10/disks 65) and require copies of those CGs (that is all chunks in the CG) to be relocated to their new locations before the new map 71 is committed. During migration under the map changes, I/O processing from the host 20 is not interrupted.

Map Change Process

In the distributed, shared-nothing architecture of the storage system in FIG. 1, each node 10 is responsible for carrying out a recovery process of its own data without centralized coordination or oversight. Further, by implementing map change event distribution algorithm using Paxos, each recovery event is distributed to each node 10 in order and each node 10 receives all events that have occurred.

Figure 7:
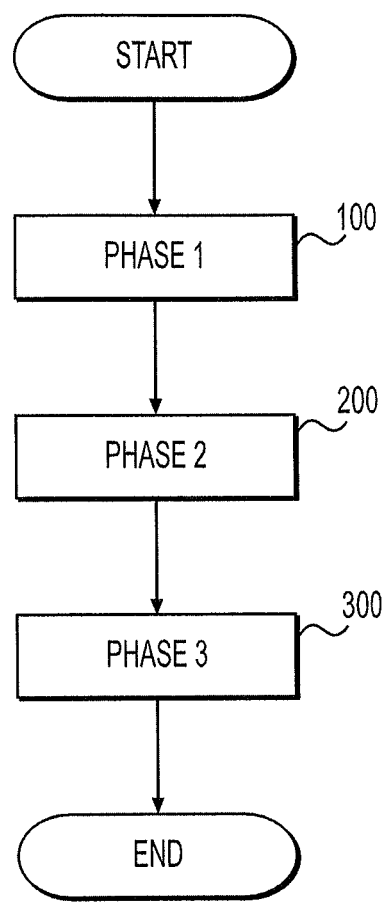
FIG. 7 illustrates a high level flow chart for the map change process according to one embodiment of the present invention.

FIG. 8 illustrates an example of an event list 125 that each node 10 manages in memory 50. As the SA 55 in each node 10 receives an event by Paxos it is stored in the event list 125 in sequential order by time. Paxos manages the order in which the events are delivered to be processed. When a node 10 comes back online, it queries its peers in the cluster to obtain a list of events and tasks it may have missed while it was offline. The node receives the events and stores them in the event list 125. As shown in FIG. 8, node 1 received a MAP_CHANGE_PROPOSAL event followed by a MAP_MIGRATE event and at a subsequent time a MAP_COMMIT event. Accordingly, the node 10 must conduct the processes corresponding to the events in sequential order. The nodes 10 cannot continue to a subsequent phase as shown in FIG. 7 until the current phase ends in a completion. Each of the three phases shown in FIG. 7 will be explained in detail as follows.

As mentioned above, when the storage capacity of the cluster is changed by the addition or removal of a node to the cluster or storage devices to a node, for example, the CRUSH algorithm is used to determine a new map for the placement of data across the cluster. The transition from an existing map (e.g., old map) to a proposed map (e.g., new map) is referred to as a map change process. During the map change process, data may be relocated on one or more nodes in order to conform with the new map. While the data is relocated, it is important that the data still be made available by the cluster to hosts 20 and that I/O processing is not interrupted during the transition. The map change process occurs in three phases.

FIG. 7 shows an abstract view of the map change process. In general, Phase One 100 consists of a map change proposal. Upon a map change proposal, each node 10 prepares for a map change and each node 10 responds to the proposal. The map change is proposed by a node or triggered by an administrative command. The map change proposal is distributed according to Paxos to all nodes 10 which are online in the cluster. Each node 10 must go through the first step of preparing itself for the map change by finishing any ongoing processing, etc. As each node 10 considers itself finished with its respective processing for Phase One, it reports, according to Paxos, that it has accepted the proposal for the map change. The proposer of the map change cannot proceed to Phase Two until all "up" nodes (e.g., nodes 10 that are online and responsive) have responded to the map change proposal and have indicated to the proposing node that the map change is acceptable. If any node 10 rejects the proposal, the proposal fails. In response to a proposal failing to be accepted by all up nodes in the cluster, another map proposal will need to be generated and accepted before entering Phase Two 200 of the map change process.

In another implementation, a cluster node 10 that is down for more than a maximum allowed time may be deleted from the configuration. The maximum amount of time may be a predetermined amount of time. A node 10 deletion may trigger a map change. In this case deletion may be interpreted by the map change proposer as a reason to fail the map change. In Phase Two 200 of the map change process, a message is sent according to Paxos that instructs all nodes 10 to proceed with processing required for the map change to take place. That is, Phase Two triggers chunk migration and write proxying in the cluster. Phase Two ends when all up nodes 10 report back according to Paxos that they have completed their respective migration processing required to implement the new map.

The Phase Three 300 consists of "committing" the map change by informing all nodes 10 that new map 71 is in effect. This causes the SAs 55 on all nodes 10 to stop using the old map 70 and start using the new map 71. In the Third Phase, the OSDs 60 for each node 10 remove data stored under the old map which is no longer stored under the new map 71.

Phase One

Figure 9:
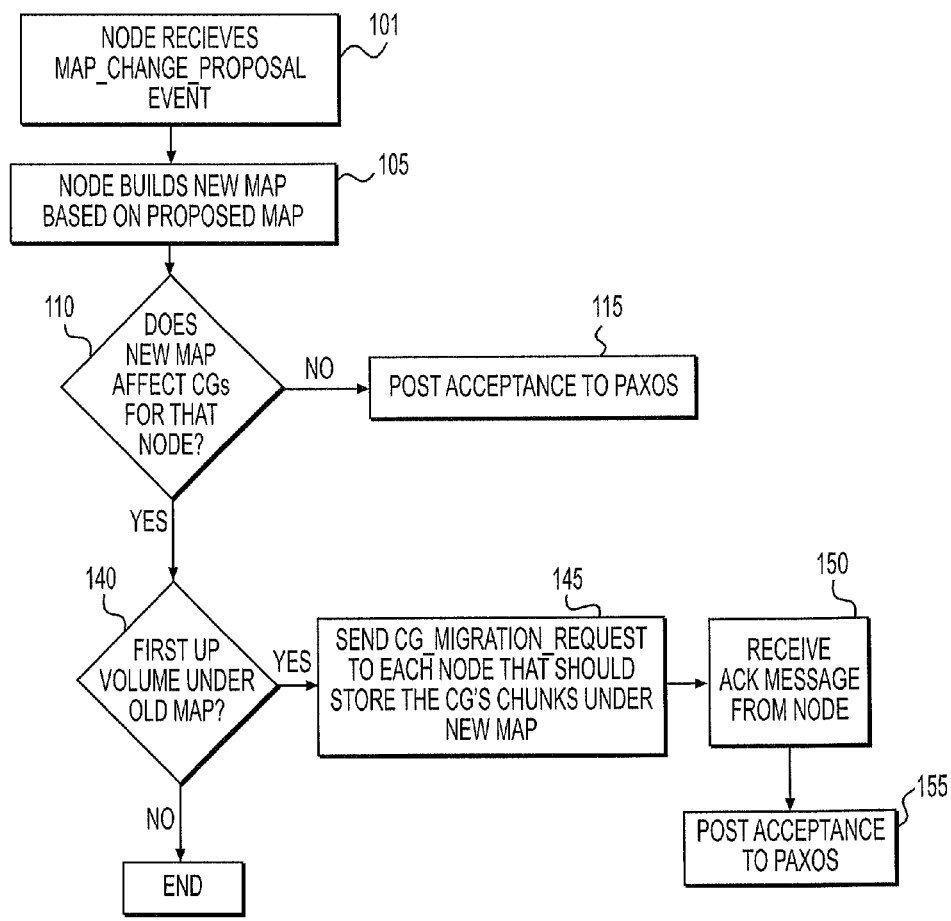
FIG. 9 illustrates a flow chart of the process of Phase One of the map change process of FIG. 7 according to one embodiment of the present invention.

Phase One is explained with reference to the flow chart shown in FIG. 9 (PHASE 1). At the start of Phase One, every node 10 receives a MAP_CHANGE_PROPOSAL event 101 according to Paxos from the proposing node of the map change. This is the Phase One message. In FIG. 9, the proposed map refers to the new map 71 for purposes of explanation. Upon reception of the event 101 by each node 10, a new map is generated in every node 10 stored in the memory 50 of the node (step 105).

At step 110, based on the new map 71, each node 10 determines whether it stores any CGs that are affected by the map change to the new map 71. The determination is made for each CG. A CG stored by a node is affected by the new map 71 if there is a change in location for the CG under the new map 71 when compared to the location under the old map 70. A comparison between the old map 70 and the new map 71 is done by checking the CGID 77 for each CG and comparing the disk lists 76 (for the old map 70 and new map 71) which correspond to the CGID 77. Each node 10 follows the steps in FIG. 9 for each CG that is affected by the new map 71. Either the node 10 has no CGs affected under the new map 71 or the node 10 has CGs which are affected by the map change. If the node 10 does not have any CGs affected, the node posts its acceptance, according to Paxos, that is has accepted the map change proposal at step 115. If the map change affects CGs already on the node, then the processing continues to step 140.

If the node 10 stores a copy on a local volume 65 of the node 10 in the old map 70, but does not store it locally under the new map 71, the node 10 posts its acceptance of the new map proposal and continues accepting I/O operations until the new map 71 is committed. If the node 10 has a copy of a CG in its local volume 65 under both the old map 70 and new map 71, the node 10 posts its acceptance of the new map 71. The node 10 also continues to accept I/O requests until the (proposed) new map 71 is made effective which will be described later in Phases Two and Three.

During Phase One, a node 10 also determines if it contains the first "up" volume in the old mapping sequence 70. Up volumes are referred to as volumes 65 in a node 10 that are online, responsive, and capable of migrating data to the new location. The up volume may be the volume that data is migrated from to a new location. There may be multiple volumes that are up, but one is designated as the first up volume. The up volume may be determined by the node as the first disk 65 in the disk list 76 produced by CRUSH for a CG based on the CGID 77.

At step 140, if a node 10 determines it has the first up volume, it is the node 10 responsible for informing the other members of the consistency group under the new map 71 that they have a CG to be stored under the new map 71. The node having the first up volume uses the new map 71 to identify the new locations for the CG's chunks. The node 10 sends a CG_MIGRATION_REQUEST message to the nodes which are members of the CG under the new map indicating that they are to receive the CG from the first up volume node at step 145. Under Phase One, there is no other way for the node members under the new map 71, who are to store the CG under the new map, to know that they are the new location for a CG's chunks unless the first up volume informs the new member nodes 10 at step 145. The CG_MIGRATION_REQUEST consists of the list of CGIDs 77 that are to be migrated. In addition, metadata corresponding to the CGs including the flag tables 120 for the chunks may be sent with the CG_MIGRATION_REQUEST. The OSD 60 of a node receiving the CG_MIGRATION_REQUEST may receive multiple such requests from multiple up volumes 65 of one or more nodes 10 if the node is to store plural CGs under the new map. The OSD 60 does not need to keep track of which node 10 sent each request because it is sufficient for the node 10 to generate a list of locations storing the CG.

Figure 10:
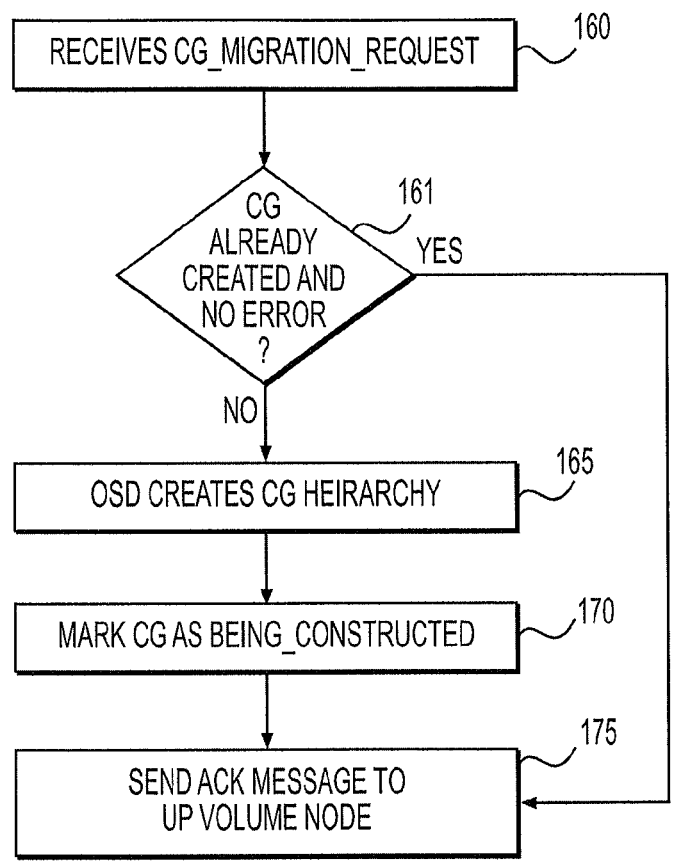
FIG. 10 illustrates a flow chart of the process of a node that receives a migration request during Phase One according to one embodiment of the present invention.

FIG. 10 illustrates a flowchart which depicts the processing for nodes 10 that receive the CG_MIGRATION_REQUEST at step 145 in FIG. 9. OSDs 60 of nodes that receive a CG_MIGRATION_REQUEST at step 160 determine at step 161 whether the CG already exists and is active. In determining whether the CG exists the node determines whether a CG actually exists or whether a CG marked as BEING_CON- STRUCTED already exists within the storage device of the OSD 60. The CG is active if it does not have an error associated with it and it is currently capable of writing to and/or reading from by the host. At step 161, if there is not a CG already created and/or it has an error, then the node 10 proceeds to step 165, which is to create a stub and CG path hierarchy for each CG that will be stored under the new map. If the determination at step 161 is a yes, then the process proceeds to step 175 because the node 10 does need to create a CG stub for this CGID, because it already exists on the node.

The CG hierarchy also includes the CG ID 77 for the CG it must store. CG metadata is created and persistently marked as BEING_CONSTRUCTED by the OSD 60 at step 170. Once the CG stub hierarchy is created, the node acknowledges the migration request by sending an ACK message to the node that sent it the CG_MIGRATION_REQUEST at step 175. The ACK message is received by the first up volume node (step 150) and once the node receives the ACK message from all nodes 10 that it has sent a migration request to, it can respond to the map change proposal event by posting acceptance to the proposal to according to Paxos at step 155. Phase One completes successfully when all nodes 10 in the cluster have accepted the map change proposal. If any node 10 fails to accept the proposal because of an error, for example, the proposal fails and the proposer must send out a MAP_CHANGE_CANCEL event.

Map Change Cancellation

If the proposal fails, every node 10 receives a MAP_CHANGE_CANCEL event according to Paxos. Upon a MAP_CHANGE_CANCEL event, the map migration state is cleared and each OSD 60 examines if it has a CG that was built for the proposed new map 71. When a node 10 receives a MAP_CHANGE_CANCEL event, the new map 71 that was built is invalidated. Further, nodes 10 that have created CG hierarchies anticipating receiving a CG under the new map 71 remove the CG hierarchies. In the case that a MAP_CHANGE_CANCEL event is sent to all nodes 10 and not every node 10 receives the event because the node 10 crashed or is otherwise offline, the nodes 10 that did not receive the event will receive the message when it comes back online to the cluster according to the event list 125 maintained by the online nodes of the cluster. Additionally, upon a map change cancellation, the SAs 55 stop sending I/O operation requests to the new map 71 members.

Phase Two

Phase Two begins with a map migration directive which is sent to the nodes 10 of the cluster according to Paxos. At step 201 of FIG. 11, every node 10 receives a MAP_MIGRATE event message, which is the Phase Two message. At step 202, the node 10 sets the map migration state to '1'. The map migration state is set so that the OSD 60 and SA 55 for each node 10 is aware that map migration has been initiated.

At step 205, each node's OSD 60 determines if they have any CGs marked as BEING_CONSTRUCTED. If the node 10 does not, at step 210 the node immediately posts an ACK message according to Paxos to acknowledge the map migration event. OSDs in nodes 10 that have CGs marked as BEING_CONSTRUCTED start a copying process by copying chunks belonging to the CG marked as BEING_CONSTRUCTED from an up volume (node 10) that has the chunks stored on it under the old map 70. At step 220, the OSD 60 for the receiving node requests a list of chunks from the node members of the old map 70 that have the CG for the CGs marked as BEING_CONSTRUCTED by referring to the list of CGIDs 77 sent with the CG_MIGRATION_REQUEST in Phase One. The old map 70 members (e.g., nodes that have the chunks stored) send the list of chunks (i.e., the copy list) 115 to the new map members.

Alternatively, each new map node 10 (nodes receiving request) request that the same old map node 10 send the list of chunks 115 and the slices for each chunk in order to exploit the caching effects in the underlying filesystem. In one case, each new map 70 node, that is to receive chunks (slices), independently decides which up volume under the old map it receives the chunks from. Different up volumes may be chosen by each new map node that is to receive the same chunks. In another case, each new map node that is to receive chunks choose the same up volume node under the old map to receive the chunks from. In the latter case, caching effects may be exploited by virtue that chunks (slices) to be sent to the new map nodes will be in the chosen up volume node's memory (from a previous disk read) and therefore a disk read is not required if the data to be transferred is already in the node's memory from a previous transfer. By way of example, if old map 70 nodes 1 and 3 store the same data to be transferred to new map 71 nodes 2 and 5, both nodes 2 and 5 send RECOVERY_READ requests to only node 1 to transfer the data. If node 2 requests data from node 1, then node 5 requests the same data from node 1, node 1 will not have to perform a disk read to send the data to node 5 because the data will be in node 1's memory.

At step 225, the receiving node 10 receives the copy list 115 and the OSD 60 keeps the list of chunks it has to process according to the copy list 115 in memory 50. The node 10 copies the chunks in the copy list 115 in sequential order. It is preferable that the copy list 115 is approximately under 10K entries per CG in order to avoid burdening the nodes with copy lists which are excessively large. At step 226, the node 10 creates a flag table 120 for each chunk.

All nodes 10 manage a flag table 120, which is a data structure stored in memory 50, for each chunk stored therein. Each node in the cluster is able to access the flag table for each chunk of each CG stored on the cluster. FIG. 12 illustrates an example of a flag table 120. The flag table 120 contains information for whether each chunk has a CLEAN flag, a DIRTY flag, or a DEGRADED flag set. Additionally, the flag table 120 stores the event number after a DEGRADED flag was set and the event number after which the data was written. A flag that is set has a value of '1', whereas, a value of '0' indicates that a flag has not been set. At step 227, the node 10 sets, for each chunk that will be copied, a DIRTY flag. If a node 10 crashes, the list of chunks needing recovery will be regenerated by scanning the CG for chunks marked DIRTY which will be explained in more detail below.

At step 228, the node 10 creates a stub for each chunk in the list of chunks it has received. FIG. 13 is an example of chunk stub management information 105 that is managed in the stub. Each OSD 60 stores the chunk stub management information 105 in memory 50 for each chunk of each CG marked BEING_CONSTRUCTED. Chunk stub management information 105 includes the chunk field 106, which indicates the chunk number that the stub corresponds to, and a CGID field 107, which indicates a CG that the chunk corresponds to. Chunk stub management information 105 also includes the old map location 108 of the chunk, and a RECOVERY_READ request sent field 109, which indicates whether the copy process for this chunk has begun or not. If the copy process has begun, the RECOVERY_READ request sent field is marked with a '1', otherwise it is marked with a '0'. The chunk stub management information 105 also indicates whether all slices of the chunk have been copied in the all slices copied field 110 and whether the I/O key list is empty in the key list empty field 111. The OSD 60 checks the bitmap 75 to confirm if all slices have been copied. If all slices have been copied, the value is set to '1', otherwise the value is '0'. The OSD determines if there are any I/O keys in the chunk's I/O key list 95 to indicate if the I/O key list 95 is empty or not. If the I/O key list 95 is empty the field is marked with a '1'.

Figure 11:
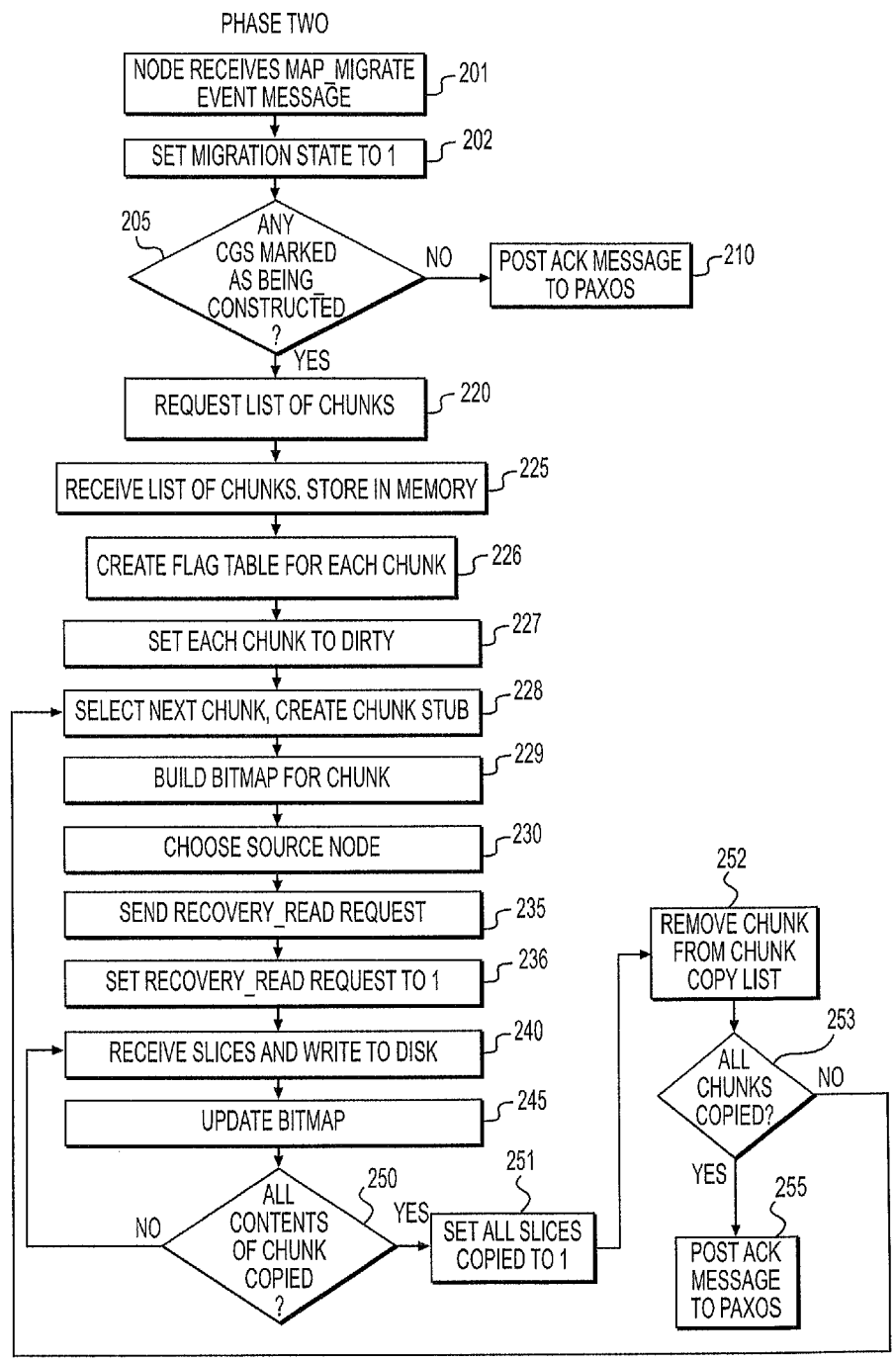
FIG. 11 illustrates a flow chart of the process of Phase Two of the map change process of FIG. 7 according to one embodiment of the present invention.

At step 229 of FIG. 11, the node 10 builds a bitmap 75 of slices for each chunk. FIG. 14 is an example of a bitmap 75. The bitmap 75 is volatile and stored in memory 50. For example, with 32K slices the bitmap that describes a 64 MB chunk will be 2048 bits, or 256 bytes. At step 230, the new location chooses a source location (up volume) from the member nodes 10 of the old map 70. The new location chooses a source volume (first up volume) 65 from the list of disks 76 created by CRUSH for the CGID 77. For example, CRUSH provides a degree of pseudo-randomness in choosing source OSDs 60 from the old map 70 and may be implemented so that all new map 71 targets send their RECOVERY_READ requests to the same source. This process leverages caching of the underlying filesystem to lower the overall impact of the recovery on the processing load of the cluster.

As shown in FIG. 3, each CG is composed of chunks, and each chunk is further composed of slices of data. During the migration of data, each chunk is migrated by transferring the constituent slices of the chunk. At step 235, the OSD 60 sends a RECOVERY_READ request to the up volume determined at step 230 to transfer the slices. The RECOVERY_READ requests are sent for each slice of each chunk that is in the list of chunks 115 that is received and stored in memory at step 225. At step 236, the RECOVERY_READ request sent field 109 in the chunk stub management information 105 is changed to '1' to indicate that copying for that chunk has begun.

As each slice of a chunk is transferred and written into the new node, the bit corresponding to that slice is changed in the bitmap 75 to indicate that it has been written at step 245. The bitmap 75 indicates which slices of each chunk have been written. Each slice for a chunk may be copied using RECOVERY_READ requests in sequential order according to the bitmap 75 and written on to the new location disk 65 of the receiving node 10 at step 240. In the exemplary bitmap 75 shown in FIG. 14, during migration, after slice 1 is successfully transferred, slice 2 is transferred next, generally following a sequential order for the remaining slices. The bitmap 75 in FIG. 14 shows multiple bits corresponding to each slice. At least one bit represents whether the slice has been copied and written into the target node or not.

The node 10 checks the bitmap 75 to determine if all the contents of the respective chunk have been copied 250. The node determines whether the bitmaps 75 for each chunk in the chunk copy list 115 indicate that all slices have been copied. At step 251, the OSD sets the all slices copied field 110 in the chunk stub management information 105 to '1' to indicate that all slices have been copied for that chunk. If any slices have not been copied, then RECOVERY_READ requests are sent for those slices at step 235. At step 252, the chunk is removed from the chunk copy list 115 on the target node. The node continues to copy slices for each chunk on the chunk copy list 115. At step 253, if not all chunks have been copied the process returns to step 228. When all of the contents of all the chunks have been copied, the new location (i.e., new node) sends an ACK message acknowledging the Phase Two event at 255. Phase Two ends when all nodes report back, according to Paxos, that they have completed their migration work.

A chunk is marked with a DIRTY flag in the flag table 120 to indicate that the chunk is being modified, by a WRITE operation, for example, or that the chunk is to be copied, as shown at step 227. The DIRTY flag is set before the chunk is written or otherwise modified. The DIRTY flag is asynchronously cleared, by the SA 55, for example, after all OSDs 60 that the SA 55 sent WRITE operations to have responded to the WRITE. If a chunk is marked DIRTY, the chunk is either on the chunk copy list 115, on the bitmap 75, the I/O key list 95, or on both the bitmap 75 and the I/O key list 95. As each chunk recovery is completed, its DIRTY flag is cleared, which is explained below.

During migration, if an SA 55 receives an I/O operation, the SA 55 must send the I/O operation directed to a particular piece of data in a CG to both, the nodes 10 under the old map 70 storing the CG and the nodes 10 under the new map 71 storing the CG. This process ensures that if a migrating chunk's contents are overwritten by a WRITE request from the host 20, for example, and processed by the SA 55 to nodes 10 under the old map 70, the chunk's integrity is maintained.

Figures 15, 16:
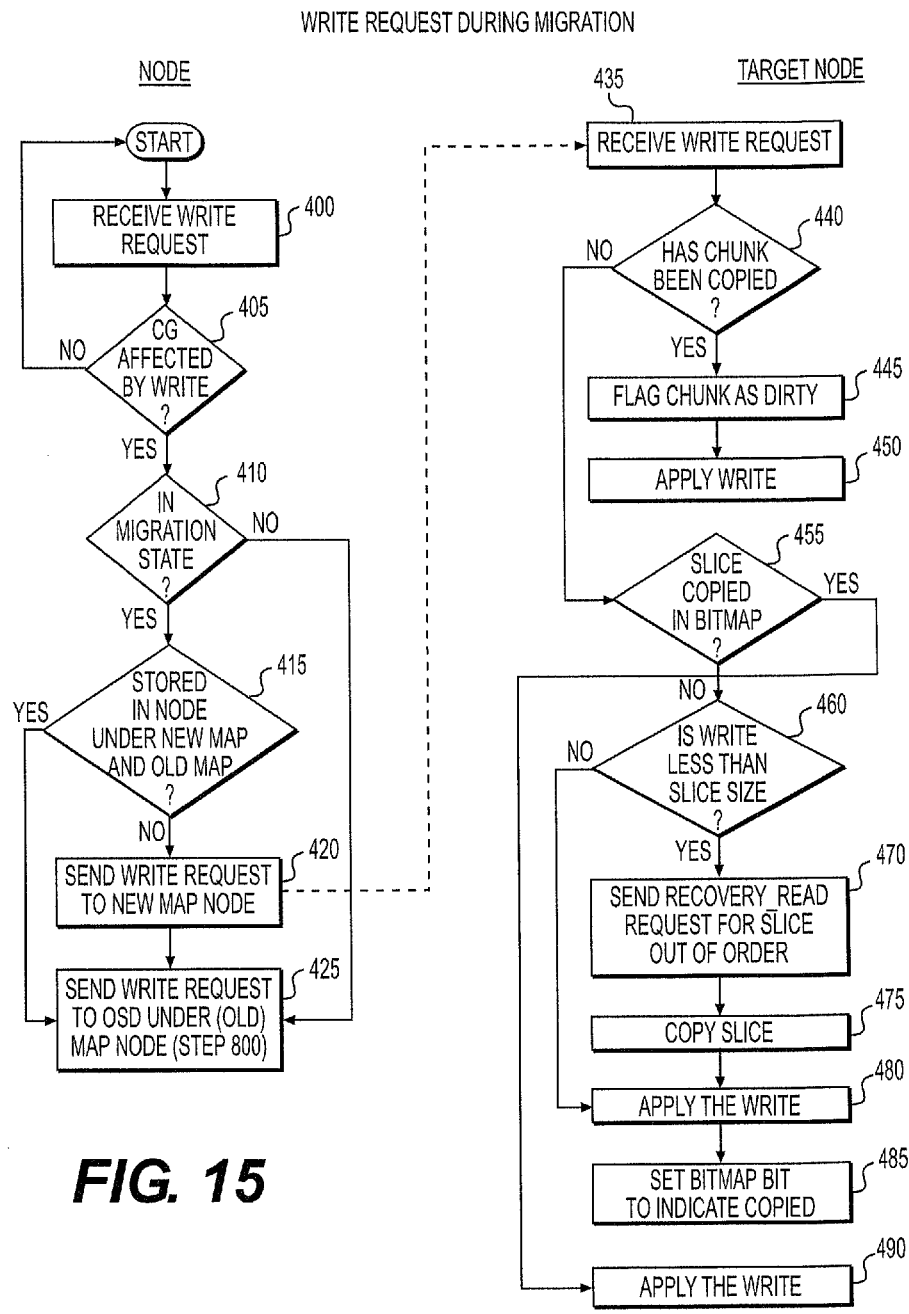
FIGS. 15 and 16 illustrate a flow chart of the process of a WRITE request during migration according to one embodiment of the present invention.

FIGS. 15 and 16 illustrate a flow chart of the process of a WRITE request during migration according to an embodiment of the present invention. At step 400 of FIG. 15, a node 10 receives a WRITE request. At step 405, the SA 55 of the receiving node 10 checks if the WRITE affects a CG that is stored under the current (old) map 70. If the SA 55 determines that the WRITE affects a CG that it stores, then at step 410, the SA 55 checks the map migration state. If the SA 55 determines that the WRITE does not affects a CG that it stores, then the process returns to the start. If the node 10 is not in a map migration state, the node 10 sends the WRITE request to the OSD 60 and the WRITE is applied normally 425. If node 10 is in a map migration state and the CG for the WRITE request is affected, the SA 55 must send the WRITE request to nodes 10 storing the CG under both the old map 70 and the new map 71. The nodes are each capable of identifying which CGs are in a migration state. At step 415, the node determines if it has a CG copy stored in its local storage device 67 under both the old map 70 and the new map 71. If it does, then only one WRITE request is sent to the OSD 60 and the WRITE is applied 425. The WRITE is applied normally and processing proceeds to step 800 of FIG. 17. Otherwise, if the node does not have a CG copy stored under both the old map 70 and the new map 71, the WRITE request is sent to the node storing the CG under the new map at step 420 and processing proceeds as shown in FIG. 16, which is described below.

Figure 26:
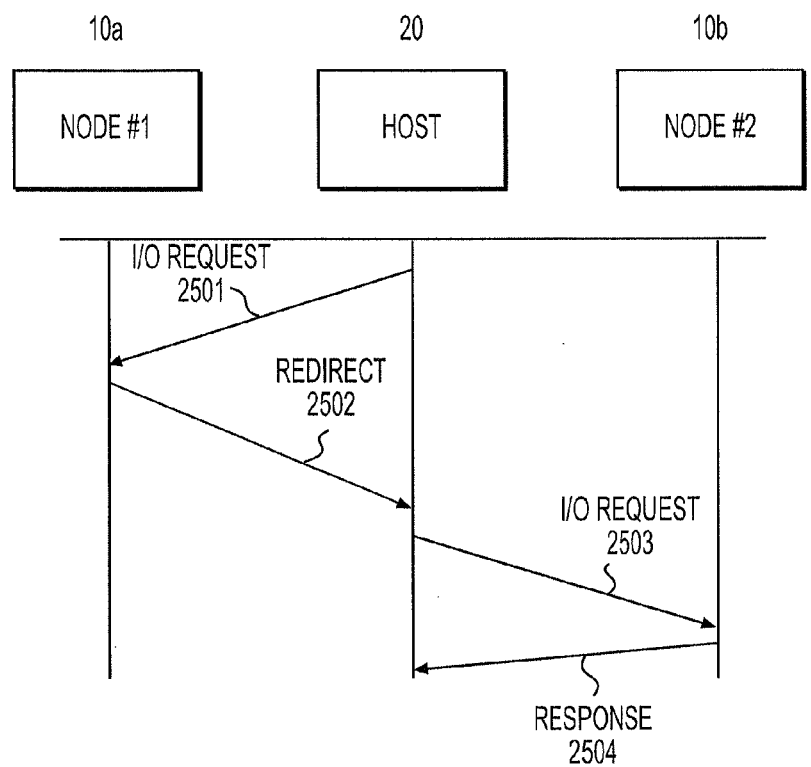
FIG. 26 illustrates a communication flow between a host and nodes for handling reception of (I/O) operations according to one embodiment of the present invention.

FIG. 26 illustrates a communication flow between a host 20 and nodes 10*a* and 10*b* for handling the reception of I/O operations. In FIG. 26, a host 20 sends an I/O request 2501 for an I/O operation on data stored in the cluster to a node 10*a* in the cluster. In some instances, the node 10*a* which receives the I/O request from the host 20 may not store the data relating to the I/O request. As shown in FIG. 26, in such instances, the receiving node 10*a* may redirect the I/O request to the proper node 10*b* by transmitting a redirect 2502 to the host 20 specifying the proper node 10*b* for the I/O operation. In response to the redirect 2502, the host 20 may send the I/O request 2503 to the node 10*b* which is the proper node to handle the I/O request. After completing the I/O operation, the node 10*b* may transmit a response 2504 to the host 20.

Figure 27:
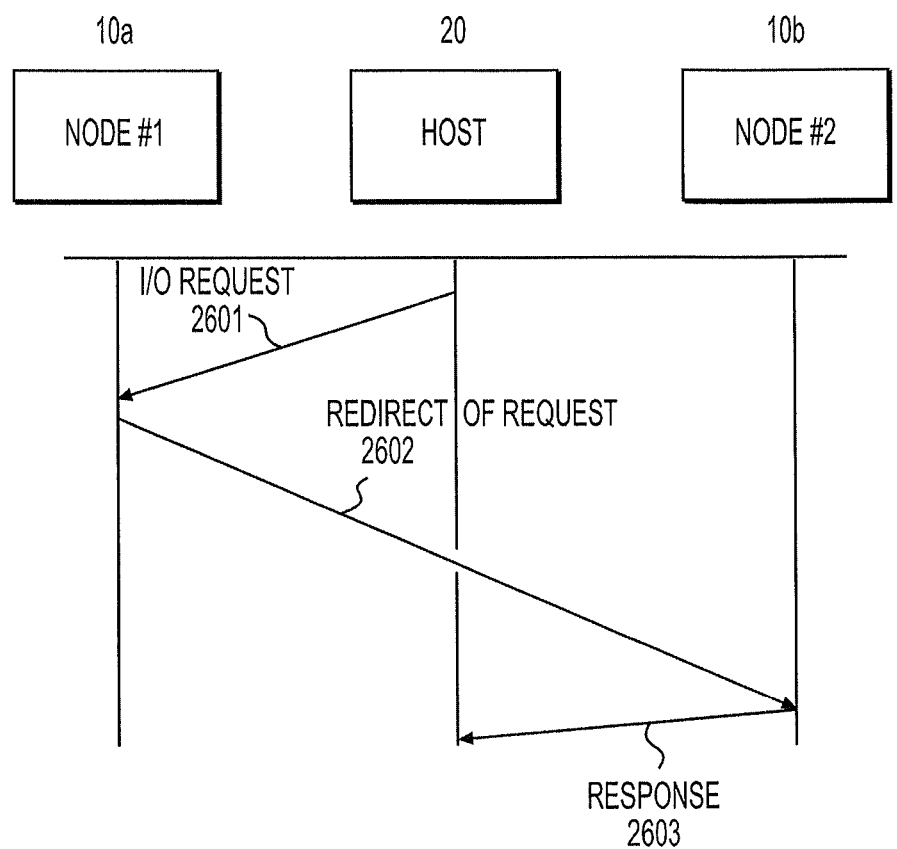
FIG. 27 illustrates an alternative communication flow between a host and nodes for handling I/O operation according to one embodiment of the present invention.

FIG. 27 illustrates an alternative communications flow for an I/O operation on data stored in the cluster to a node 10*a* in the cluster. In FIG. 27, the host 20 sends an I/O request 2601 for an I/O operation on data stored in the cluster to the node 10*a* in the cluster. In some instances, the receiving node 10*a* may redirect the I/O request directly to the proper node 10*b* by transmitting a redirect 2602 to the proper node 10*b* for the I/O operation. After completing the I/O operation, the node 10*b* may transmit a response 2603 to the host 20.

Figure 17:
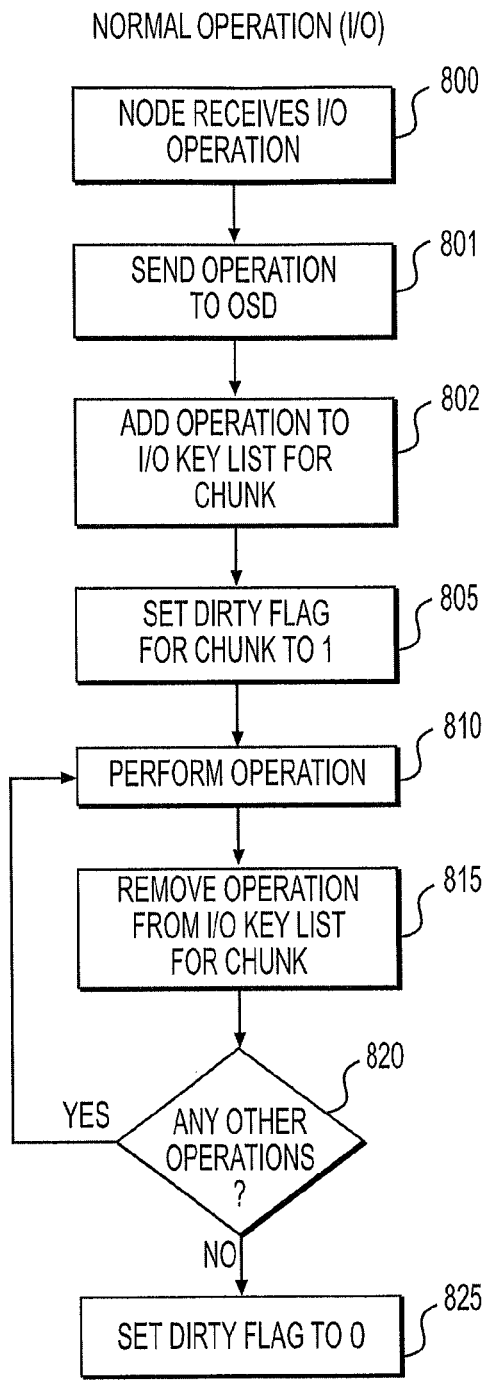
FIG. 17 illustrates a flow chart of the process of a node receiving an I/O operation during normal conditions according to one embodiment of the present invention.

FIG. 17 illustrates a flow chart of the process of a node 10 which receives an I/O operation during normal conditions. Normal conditions may be defined as when the map migration state is 0, indicating that migration under the map change process is not currently being processed in the node. At step 800, the SA 55 for a node 10 receives the I/O operation.

Upon receiving the I/O operation, the receiving node then sends the I/O operation to the OSD 60 for the node 801 and the OSD 60 adds the operation to the I/O key list 95 for the chunk corresponding to the I/O operation 802. At step 805, the node sets the DIRTY flag in the flag table 120 for the chunk to '1'. The I/O operation is performed by the OSD 60 on the chunk at step 810. At step 815, the operation is removed from the I/O key list 95 of the corresponding chunk. The process continues to step 820 when the node 10 determines if there are any other operations in the I/O key list 95 of the chunk. If there are other operations for the chunk, the process proceeds to step 810 and the operation is performed. If there are not any other operations, the DIRTY flag is set to '0'. in the flag table 120 corresponding to the chunk 825. In the alternative, the process may proceed to step 825, from step 815 without checking whether there are any other operations at step 820 before proceeding to step 825.

If any of the new map 71 members fail to complete the WRITE request, the SA 55 marks the chunks in the new map 71 as DEGRADED with a DEGRADED flag in the flag table 120. Additionally, the SA 55 of nodes in the old map 70 mark a chunk as DEGRADED if any of the old map 70 members fail the WRITE. A chunk is marked as DEGRADED to indicate that the chunk is being written when its known by the node 10 that not all copies of the chunk (not all CG copies) are online and responsive. A chunk is marked as DEGRADED either because the SA 55 flags the I/O request as creating the DEGRADED state, or because the SA 55 requests a DEGRADED mark of a DIRTY chunk that was just written and the SA 55 knows that some mirrors (e.g., nodes storing CG copies) had returned errors or crashed during the WRITE, but there are still enough CG copies present to form a quorum to recover the data reliably. Marking a chunk as DEGRADED allows removing the DIRTY flag and not losing the information about the need to recover the chunk when inaccessible copies become accessible again, for example, when a node comes back online after a failure. Additionally, the SA 55 of nodes corresponding to the old map mark a chunk as DEGRADED if any of the old map 70 members fail the WRITE. All nodes 10 of nodes corresponding to the old map clear the DEGRADED flag if the nodes 10 thereof determine that all the copies of the CG are present and recovered.

Throughout the migration process, all nodes 10 in the old map 70, including nodes 10 that will not be storing data under the new map 71, continue accepting I/O requests. The SAs 55 for each node 10 under the old map 70 node forward the WRITE, TRUNCATE, and REMOVE requests to the new locations, as explained above with reference to FIG. 15. The SA 55 sends the operations to the respective new locations in parallel with requests to the old locations.

FIG. 16 illustrates a flow chart of the process of a target node receiving a WRITE request from the SA 55 that stores a copy of the CG under the old map. At step 435, the new location receives a WRITE. At step 440, the node 10 checks the chunk stub management information 105 to determine if all slices of the chunk have been copied by referring to the all slices copied field 110. If the chunk has already been copied from a source (i.e., it is CLEAN), it is marked as DIRTY at step 445 and the WRITE is applied immediately to the chunk (step 450). If the chunk is marked as DIRTY, the OSD 60 checks the bitmap 75 to determine if the slice for which the WRITE applies has been copied or not at step 455. If, in step 455, the bitmap 75 indicates that the slice has been copied, then the WRITE is applied to the corresponding slices at step 490. If the slice for which the write applies has not been copied, the node checks whether the data that is to be written by the WRITE operation is less than the slice size at step 460. If the data that is to be written by the WRITE is not less than or it is equal to the slice size, then the WRITE is applied in the appropriate slice location 480. The bit in the bitmap 75 is changed for that slice so that the slice will not be subject to being copied over to the new map location during migration (step 485). If the data that is to be written by the WRITE is less than the slice size, then the RECOVERY_READ processing for that slice is sent out of order (i.e., out of sequence from the order of slices) in the bitmap 75 so that the data for that slice can be migrated 470. That is, the RECOVERY_READ for that slice is sent before slices that would normally be transferred next in the sequential order according to the bitmap 75. Once the data for that slice is migrated and copied 475, the WRITE operation is applied and the bit in the bitmap 75 is changed for that slice to indicate that it has been copied at step 485.

Other modifying operations such as TRUNCATE (to truncate) or REMOVE (to delete) are sent to nodes 10 under both the old map 70 and new map 71. In general, the same processing for WRITE requests applies for TRUNCATE and REMOVE operations. Truncation processing differs depending on how far the copy process has progressed. If a chunk has not been copied yet, the TRUNCATE operation is a non-operation that succeeds. If the chunk has already been fully copied (it is CLEAN), it is marked as DIRTY in the flag table 120 and the TRUNCATE operation is applied normally. If the chunk is DIRTY (being copied) when there is a TRUNCATE operation and the bitmap 75 indicates that the truncation point is past the current copy offset (not yet copied), the TRUNCATE operation is a non-operation that succeeds. If the chunk is DIRTY when there is a TRUNCATE operation and the bit indicates that this slice of the chunk has already been copied, then the chunk is locked to prevent further copying from the source. The chunk is then truncated according to the TRUNCATE operation and the chunk is not further copied from the source.

If during migration, the I/O operation is REMOVE, the chunk is removed from the new location and is purged from the in-memory structures. In this case, the OSD 60 waits until the pending copy, if any, of the chunk is copied before the chunk is removed. If a chunk is being removed from a CG, the new map members remove it as well.

Figure 18:
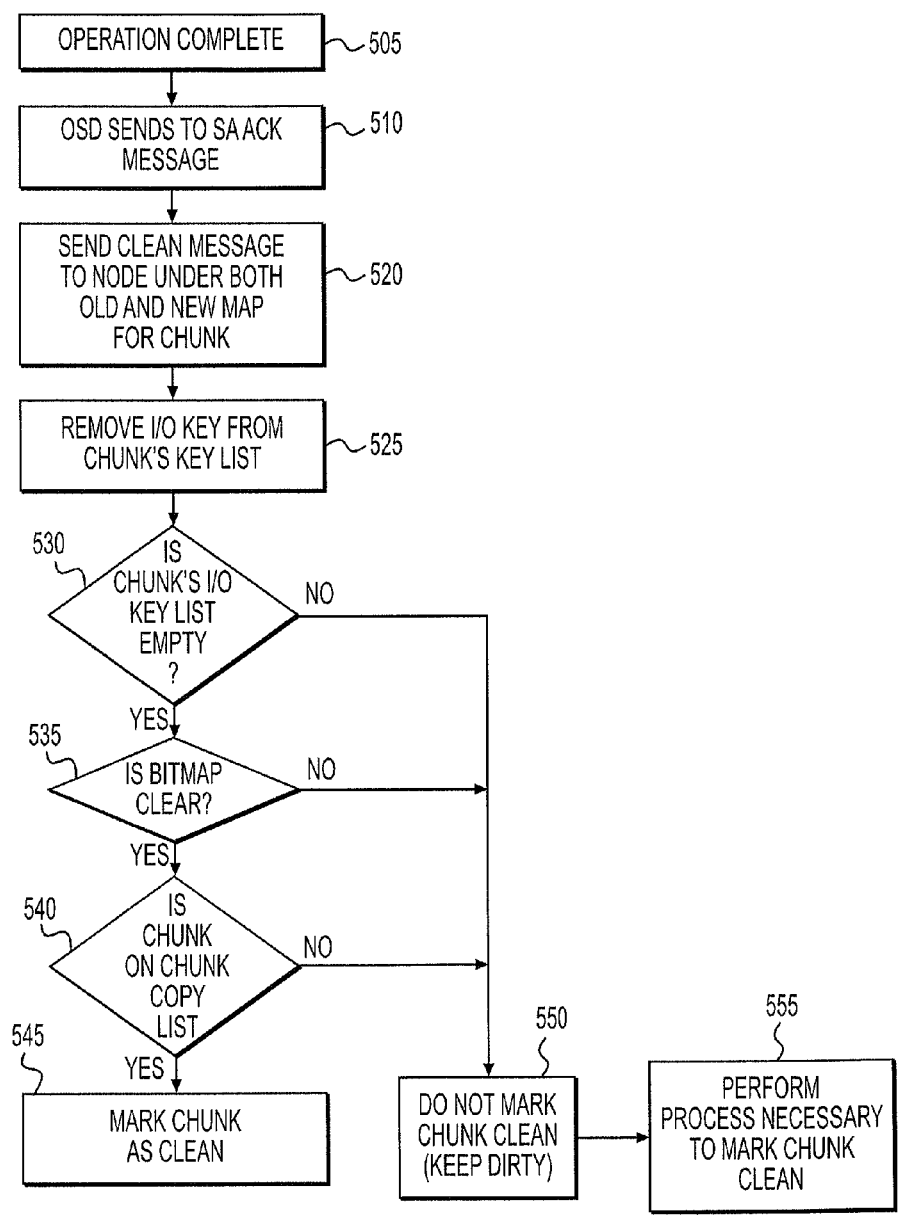
FIG. 18 illustrates a flow chart of the process of setting a data chunk to clean after I/O operation during migration is completed according to one embodiment of the present invention.

During I/O processing during migration, the new location's OSD keeps the requesting SA's key tracked in the same way the OSD 60 would in a normal WRITE operation. FIG. 18 illustrates a flow chart of the process of setting a CHUNK to clean after I/O operation during migration is completed according to the present invention. At step 505, when the operations have been completed, the OSD 60 replies with an ACK message to the SA (step 510). Thereafter, the OSD 60 sends CLEAN directives to nodes 10 in both the old map 70 and the new map's 71 OSDs 520. At step 525, for each chunk, each new location removes the I/O key from the chunk's I/O key list 95. The new location node 10 checks the following before setting the chunk to CLEAN: if the chunk's list of outstanding I/O keys 95 is empty (step 530), if the bits in the bitmap 75 indicate that all slices have been copied (step 535), and if the chunk is on the chunk copy list 115 (step 540). In the alternative, the node 10 may check if all slices have been copied by referring to the chunk stub management information 105 to determine if the all slices copied field is '1' or '0' at step 535. If not all of these factors are met, then the chunk is left DIRTY at step 550 in the flag table 120. If all of these factors are met, then the DIRTY flag is cleared for that chunk and the chunk is marked as CLEAN at step 545 in the flag table 120 corresponding to the chunk. At step 555, the node performs the process necessary in order for the chunk to be marked clean. For example, if it is determined, in step 530, that the chunk's I/O key list is not empty, then the node performs the outstanding I/O operation. After the process is complete, the chunk is checked again to set the chunk to CLEAN (i.e., steps 530-540). A factor that may be considered in determining whether to set the chunk to CLEAN may also include determining whether WRITE operations to the CG for at least a predetermined value indicating a quorum have been successfully completed. A chunk is left DIRTY and it can be recovered when there is a quorum. In this case, all CG copies and their chunks can be examined, including taking into account the Paxos event numbers. In other words, the system verifies that all copies for a chunk are identical when enough copies are available. Alternatively, the DIRTY flag is cleared when WRITE operations to at least a quorum of copies of the CG have successfully been completed. The quorum is a minimum number of nodes which have CLEAN copies of the chunk/CG.

Once a quorum is established all nodes determine if any copies of a chunk have a DIRTY flag. If there are chunks that have a DIRTY flag, then the node that has the DIRTY copy stored thereon chooses an up volume and sends RECOVERY_READ requests to recover the chunks. The node chooses an up volume member from the new map 71.

Node Crash

During migration the node 10 or a disk 65 on the node 10 may crash, which interrupts migration, and in this case it may be that a WRITE operation ongoing during migration may be the only portion of a chunk that is processed before the node crashes. This situation is detected and recoverable by virtue that such a chunk is DIRTY on the flag table 120 and the CG is marked as BEING_CONSTRUCTED during the migration, which indicates the corresponding data content is unreliable.

Figure 19:
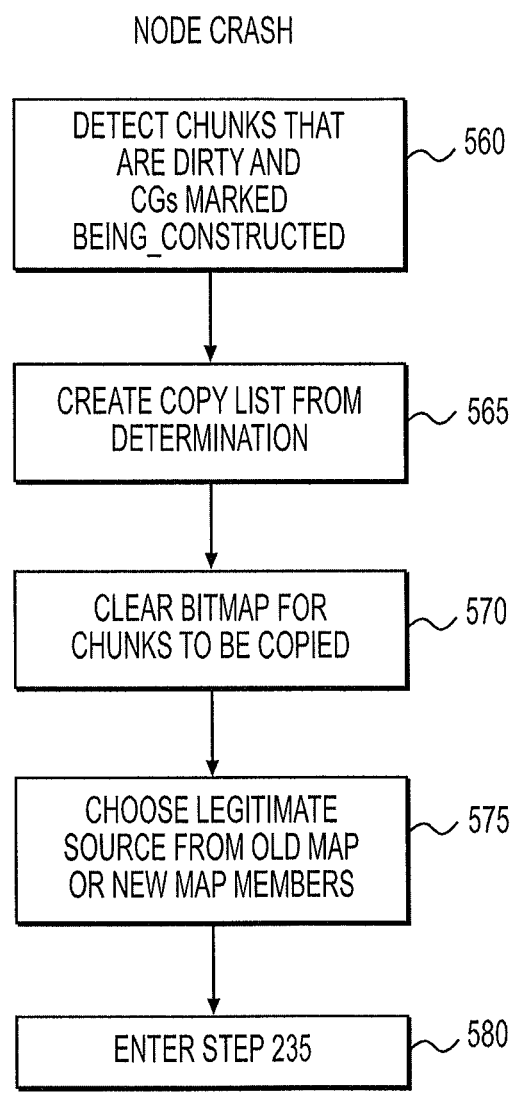
FIG. 19 illustrates a flow chart of the process of a target node when coming back online after a failure according to one embodiment of the present invention.

FIG. 19 illustrates a flow chart for the process that a node follows when it comes back online after a crash. When the node 10 or disk 65 comes back online, the node determines which chunks are marked DIRTY and which CGs are marked as BEING_CONSTRUCTED at step 560. In the alternative, the node 10 may refer to the chunk copy list 115 to determine which chunks need to be copied, if the list is available after the node crash or failure. From this determination, the node 10 creates a list of chunks to be copied at step 565. The node clears the bits from the bitmaps 75 for the chunks that will be copied even if some slices are indicated as having been copied before the crash 570. Additionally, at step 570, the chunk stub management information 105 is cleared. The node 10 chooses a legitimate source node (up volume) to copy the chunks from at step 575 and the whole chunk, including the newly written bits, will be copied from the legitimate source using RECOVERY_READ requests. At step 580, the processing proceeds to step 235 of FIG. 11 to send RECOVERY_READ requests to the determined up volume from step 575 and proceeds according to the processing following step 235 of Phase Two to copy the data.

If a node crashes during a normal operation (i.e., not during a map change or migration), the node recovers following the above routine except it does not post an ACK message to Paxos as in step 255 of FIG. 11. If the node crashes during an I/O operation that modifies data, such as a WRITE operation, the node will recover the newly written data from the determined up volume. Therefore data integrity is maintained.

The legitimate source may be the node from the old map 70 resuming migration or the new map 71 members who have recovered enough themselves to complete the map change that was interrupted. Each failed node may then go through the processing of setting the chunks as CLEAN, as described above.

Source Node Failure During Map Migration

Figure 20:
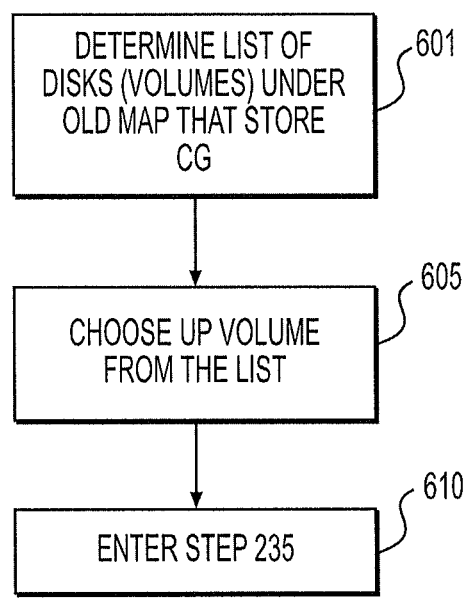
FIG. 20 illustrates a flow chart of the process of recovery of a source node failure during migration according to one embodiment of the present invention.

If a source node 10 or a disk 65 on the node 10 crashes during migration, the following processing flow is initiated as illustrated in FIG. 20. For each CG that was not fully copied before the crash, the members of the new map 71 that were receiving chunks from the failed source node use CRUSH to generate a disk list 76 under the old map 70 that has the CG stored on it for the CG that needs to be migrated at step 601. The node then chooses the first up volume in the list at step 605. The volume 65 that is determined to be the first up volume is called the "valid" copy. The node determined to hold the valid copy recovers peer nodes under both the old map 70 (including the same node that has crashed and is now back online) and new map 71. The valid copy now receives RECOVERY_READ from the target node (e.g., step 235). In other words, the target node selects a new up volume among the old map members to be the source of data transfer. In other ways, the normal recovery process, as described above, is the same. The valid OSD recovers the node or nodes 10 that crashed during migration when they come back online. The valid OSD is aware that the crashed location is back online by checking the state information 100 available to all nodes.

According to this aspect of the invention, only a single routine is needed for a source node 10 to recover from a failure. The routine checks the map migration state of the cells to determine if they are in Phase Two of map migration when generating the peer lists and when determining which OSD is the valid OSD.

CG Determined Non-Writeable

If a target node 10 crashes, or a disk 65 thereof crashes, the nodes 10 that store copies of the CG determine if a quorum is maintained despite the failure of the target node. The quorum is maintained when the number of nodes 10 or disks 65 storing copies of a CG are above the quorum value. The quorum value is a predetermined value that each node 10 is aware of. In the alternative, the quorum may also be satisfied if the number of OSDs 60 containing chunks for a CG is above a predetermined quorum value. If the nodes 10 under the new map 71 maintain a quorum, the recovery continues. If the number of new map 71 members falls below the quorum, the remaining OSDs 60 complete the recovery, but the CG may be determined to be non-writeable. If a CG is determined to be non-writeable, this condition is changed on the next map change. A CG is determined to be non-writeable if a quorum is not currently available.

If the source node 10 crashes or a disk 65 thereof fails, migration continues as long as there are other source OSDs 60 that are up (as explained above). If the all of the source copies are down, the target nodes 10 (receiving nodes) abandon migration. In this case, CG copies constructed on the targets will remain marked BEING_CONSTRUCTED and will be recovered, if possible, when the source copies come back online and are made available. In this case, the CG copies marked as BEING_CONSTRUCTED are not readable or writable, except for recovery purposes.

Phase Three

Figure 21:
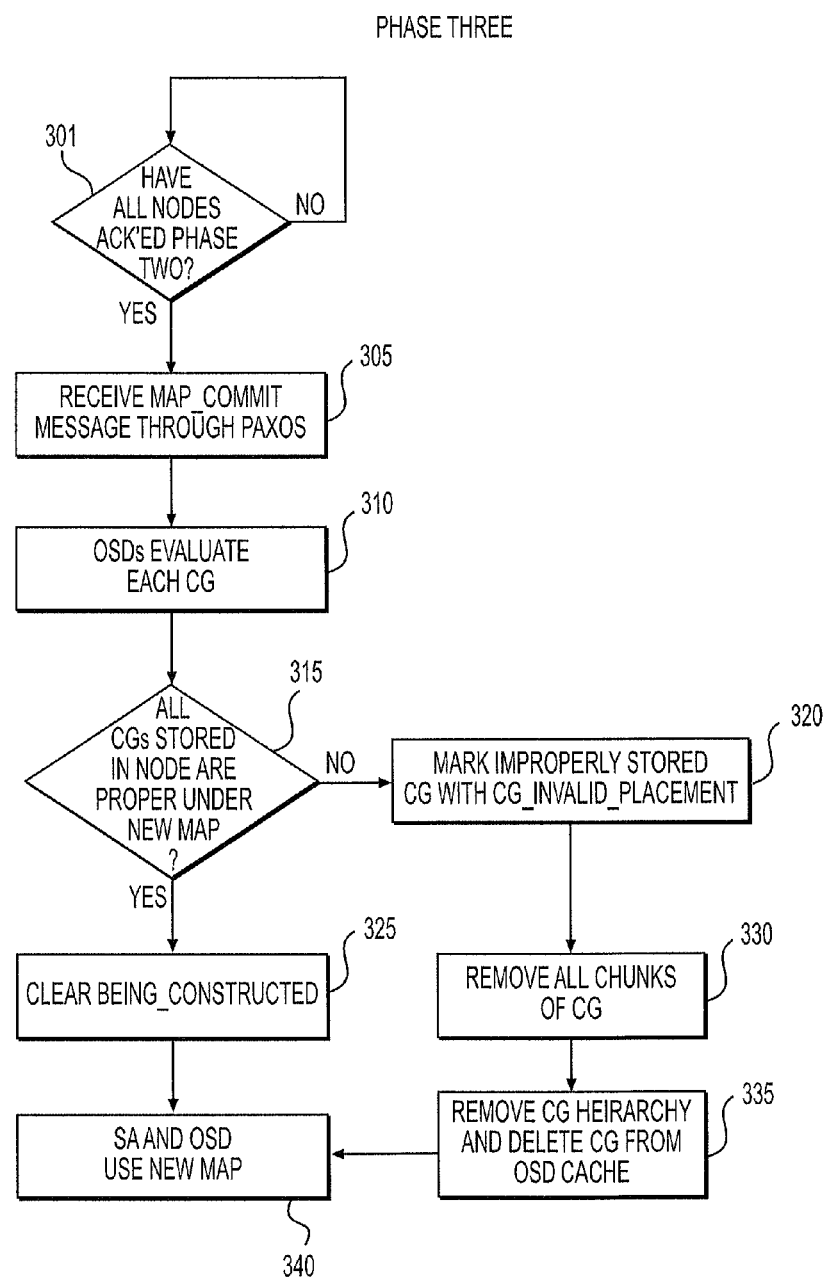
FIG. 21 illustrates a flow chart of the process of Phase Three of the map change process of FIG. 7 according to one embodiment of the present invention.

FIG. 21 illustrates a flow chart of the process of Phase Three according to an embodiment of the present invention. At step 301, the proposer checks if all nodes 10 have acknowledged Phase Two by generating an acknowledgment as shown at step 255. When all nodes 10 have acknowledged Phase Two, Phase Two is complete. The proposer initiates Phase Three of the map change, which is the commitment of the proposed map 71. At step 305, the MAP_COMMIT event message for the map change is sent according to Paxos to all nodes of the cluster. At step 310, all the OSDs that have received the commit message evaluate the CGs that they store. Each OSD checks each CG it stores against the new map 71 to check, for every CG it stores, if the node 10 is the proper holder of the CG under the new map at step 315.

If the node 10 determines that a CG it stores is not indicated under the new map 71 as being stored by the node, the node 10 marks the CG with a persistent CG_INVALID_PLACEMENT flag at step 320 and initiates asynchronous removal and space reclamation of all of the chunks in that CG at step 330. All chunks stored for that CG are removed from the node 10. After removal of the chunks, the CG hierarchy and chunk stub management information 105 is removed and the CG is further deleted from the cache corresponding to the OSD 60 at step 335. If the OSD finds that it properly stores the CG according to the new map 71, it clears the BEING_CONSTRUCTED flag from the CG if that flag is set at step 325. At step 340, the new map is committed and every SA now uses the new map and every node now accepts I/O operations according to the data placement of the new map 71.

Redundancy Policy Change

Persons of skill in the art will appreciate that redundancy levels may be changed in the storage system. For example, a redundancy policy for a storage system may be set between RAID1-RAID6 and may be changed thereafter. The redundancy level may be reflected in the cluster as follows and is described with respect to a policy change using different mirror counts for RAID1.

The mirror (copy) policy may be changed by an administrative command, for example. A map change proposal may also take place on the basis of a change in redundancy levels. Whether the change in policy is an increase or a decrease, a new map 71 is created. In the case of increasing the number of mirrors, a map change takes place because the number of redundant CG copies must be distributed in the cluster according to the layout of a new map. In the case of decreasing the number of mirrors, a map change takes place to remove a copy of the CG from the nodes in the cluster and redistribute the placement of the remaining data within the cluster.

Figure 22:
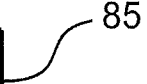
FIG. 22 illustrates a policy table for consistency groups according to one embodiment of the present invention.

FIG. 22 is an example of a policy table 85 which shows the mirror count associated with each CG. In this example, a mirror count is specified for each CG, but the mirror count could also be specified for the entire cluster or sub-sections thereof. The mirror count is an integer, 3, for example, and may be specified by an administrator. Additionally, a mirror count default may be set by the storage system for all CGs in the cluster.

According to the CRUSH sequence, disks 65 (volumes) are added and removed at end of the sequence. That is, if CRUSH is asked for 3 disks, it produces a disk list 76 {A, B, C}. If CRUSH is then asked for 4 disks it will produce a disk list 76 {A, B, C, D}, while asking for 2 disks will produce a disk list 76 {A, B}. Regardless of the nature of the change, the storage system is guaranteed that either the first up-member of the list was in the previous disk list 76, or else the data is completely inaccessible and nothing can be done for a chunk until a disk 65 from the previous CG list becomes available.

Figure 23:
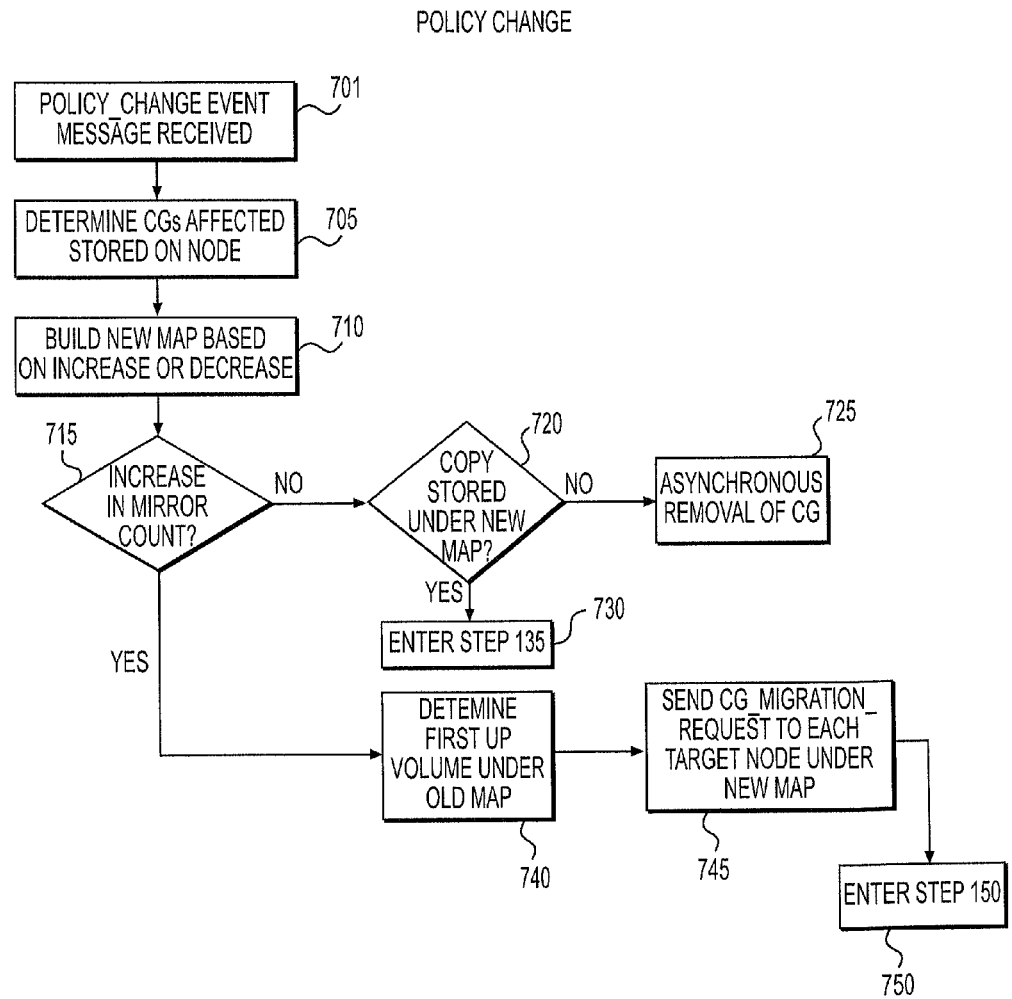
FIG. 23 illustrates a flow chart of the process of a change in redundancy level policy according to one embodiment of the present invention

The flow chart in FIG. 23 shows a process for a policy change in the storage system. An administrator increases or decreases the mirror count for a CG. The new mirror count is stored in the policy table 85. For a policy change to occur, a POLICY_CHANGE event message is sent to the nodes 10 in the cluster according to Paxos. The POLICY_CHANGE event message includes whether the policy change is an increase or a decrease in mirror count for a CG. The message is received by the OSDs 60 in the cluster at step 701. At step 705, the node determines which CGs are affected by the policy change that it stores. At step 710, for each CG that is affected, the node builds a new map 71 based on the change. If the policy change is an increase, a new map 71 is built that includes a new location for a replica copy of the respective CG. If the policy change increased the number of mirrors by 2 for example, the new map 71 will have two new locations for replica copies of the CG. According to the new map, a new copy of the CG generated to conform with the policy change will be stored at a location in the cluster which did not store the CG prior to the policy change. If the policy change is a decrease, the new map 71 will not include one or more replica copies (depending on the difference of mirror counts between the old policy and the new policy) of a CG that was included under the old map 70.

At step 715, the node determines whether the policy change reduces the number of copies of CGs or increases the number of copies of CGs. If the policy reduces the number of copies and the OSD 60 finds that it is no longer required to store a copy of the CG under the new map at step 720, it initiates an asynchronous removal of the CG from its local storage at step 725. If during step 720 the node determines that it stores a copy of the CG under new map 71, even though other copies may be removed elsewhere on the cluster, it proceeds to step 135 of FIG. 9 (i.e., post acceptance to Paxos in Phase One).

However, if the policy increases the number of copies, an OSD 60 of a node 10 from the current (old) map 70 informs either all members that store the CG under the new map 71 or only the nodes 10 that are new under the new map 71, depending on whether the disk list 76 is available under the old policy, that those nodes must now store a copy of the CG. At step 740, the first up volume of the disk list, as produced by CRUSH, is determined to be the node 10 that will inform all target node members under the new map 71 that they have a CG to store. The new members are subsequently notified at step 745, by sending a CG_MIGRATION_REQUEST to each target node 10 under the new map 71. At step 750, the process proceeds to step 150 of Phase One of the map change process.

In the case that a particular CG is stored on disks 65 that are not available at the time the list is produced for the policy change, such a CG will not get found by any nodes that are up and will not go through the policy change recovery. However, the policy change event will be recorded and available according to Paxos to the OSDs 60 that store the CG when the target node 10 comes back online and the node will go through the recovery process at that point.

The storage system of the present invention tracks disk 65 and node 10 failures. If after a predetermined period of time, the disk(s) 65 or node(s) 10 that went offline, do not come back online, they will be deleted from the map configuration and a new map 71 will be proposed. In this case, the new map 71 triggers data migration and replication of data into the new map 71 according to the map change process described above. As a result, the level of redundancy specified by the redundancy policy will be recovered. The predetermined time may be based on considerations of minimizing the probability of subsequent failures which would result in a total loss of all copies of some data. A system administrator may issue a map change command as well.

Recovery of Partially Written Data

Details of some of the steps for the following routine have been described previously and are not repeated below. Each node receives notification of an event in the cluster. An event may be a failure of a disk or a node, or a disk or a node rejoining or being added. Each node in the cluster, upon notification of the occurrence, evaluates the CGs it stores to determine if it stores any copies of CGs affected by the event. The node then determines whether it needs to take action to reconstruct or copy chunks for affected CGs based on the occurrence. FIG. 24 illustrates a flow chart of the process of recovery of a node of partially written data after rejoining the cluster according to an embodiment of the present invention. FIG. 25 illustrates a message sequence of the process of recovery of a node of partially written data after rejoining the cluster according to an embodiment of the present invention.

At step 900, a node or disk 65 (logical volume) rejoins the cluster after it has been offline. A disk may be declared offline if it fails an I/O operation and a retry or recovery I/O operation has also failed. The node/disk (volume) comes back online and is in an active state, this node 10 is referred to as the rejoined node. All nodes are aware that a node 10 rejoined the cluster 901 by notification and reference to the state information 100. At step 905, all nodes, including the node that rejoined, determine if, under the current map, it has any CGs that are stored on the rejoined node. For each CG that it determines has a copy on the rejoined node, the node determines, by checking the flag table 120, if any of the chunks for the CG have a DEGRADED or a DIRTY flag set.

Upon the YES determination in step 910, at step 915, the node 10 calculates the list of chunks 115 that have the DEGRADED or DIRTY flag set and sends the list to the rejoined node. The rejoined node receives lists from multiple nodes at step 915. The list sent by each node at step 915 includes information relating to each chunk. The information is determined from the flag table 120. The information in the list includes, for example, whether the chunk has a DEGRDED flag set or DIRTY flag set, the event number after which the chunk was written by a WRITE operation to the chunk, and the event number after which the DEGRADED flag was set. The event is the message from Paxos and the event number is the sequence number associated with the message informing the cluster of the device failure. Accordingly, if the event is a disk failure, the message is sent via Paxos with a sequence number higher than the number at which the WRITE was performed. Therefore, a Paxos sequence number associated with the DEGRADED state allows the system to unambiguously determine which copies are stale.

After reception of the lists in 915, the rejoined node determines the first up volume under the current map for each CG that has chunks that need to be recovered. The node determines the first up volume based on the information in the list. From the information in the list, the node can determine which node stores the most up to date copy of a chunk and which copies are sufficient to reconstruct the chunk for the CG. Upon determining the up volume, the rejoined node sends RECOVERY_READ requests to the up volume for each node that needs to be recovered or rewritten 925. At step 930, the rejoined node receives the data and rewrites the chunk or reconstructs the chunk based on the other copies of the chunk on the other nodes. At step 935, the rejoined node determines if all of the data has been recovered for the CGs it stores under the current map. If the rejoined node has not recovered all of the data, then it sends RECOVERY_READ requests until all chunks are reconstructed.

When the rejoined node determines that all chunks are rewritten or reconstructed at step 935, the rejoined node, at step 940, sends a message to all nodes that sent an information list 914 to inform them that the recovery is complete. At step 945, all nodes determine if all copies of the chunk are present and recovered. All chunks are present and recovered if each node and disk that stores a chunk copy is online and if all chunk copies are determined to be the same and identical to the chunk with the highest event number associated with its DEGRADED state. If all chunks are present and recovered, then all nodes, including the rejoined node, clear the DEGRADED flag for each chunk in the flag table 120 (step 955). In step 945, if a node discovers during its determination that all of its chunks are not present and recovered then the node calculates the up volume for the chunk that needs to be recovered and sends RECOVERY_READ requests to the up volume to recover the data.

In alternative method, after all nodes determine that they store a CG copy on the rejoined node in step 905, each node sends a list of affected CGs and associated metadata to the rejoined node. The rejoined node then calculates a list of CGs and sends its own list of CGs and metadata to all nodes in the received list of locations. After receiving the list of CGs and metadata, each node, including the rejoined node, examines the CG metadata received and determines if the CG copy it stores is missing data that exists on other copies, or if the node's copy is in need of recovery from other copies. If it is in need of recovery from other copies, the node follows the routine described in FIG. 24 from step 920 and forward to recover the data.

As can be appreciated from the foregoing disclosure and teachings provided herein, the embodiments of the present invention can be implemented in the form of control logic in software or hardware or a combination thereof. The control logic may be stored in an information storage medium as a plurality of instructions adapted to direct an information-processing device to perform a set of steps as disclosed in the embodiments of the present invention. Based on the disclosure and teachings provided herein, a person of ordinary skill in the art will appreciate other ways and/or methods to implement the present invention.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope and equivalents thereof.

What is claimed is:

1. A distributed shared-nothing storage system comprising:
  a plurality of independent nodes in a cluster connected to one or more networks, each node comprising one or more storage devices for storing data;
  each node is configured to send and receive input/output (I/O) operations;
  the data stored on the plurality of nodes in the cluster includes replicas of the data, wherein each node is aware of locations of the data and data replicas stored on the storage devices in the cluster based on a location map; and
  state information, which indicates a status of each node and each storage device on each node, which is available to all nodes in the cluster, wherein:
    upon activation or inactivation of a node, or activation or inactivation of a storage device on any node in the cluster, the state information is updated and changed based on the corresponding activation or inactivation, based on a change in the state information, each node in the cluster, including a newly activated node or node that has a newly activated storage device, determines if it must perform a recovery operation to maintain a consistency of any data or data replicas stored on the nodes in the cluster, and each node performs the recovery operation, if needed, independently from other nodes in the cluster to restore the data stored on its storage devices by sending and receiving messages to the other nodes in the cluster that store affected data.

2. The distributed shared-nothing storage system of claim 1, wherein:

the data in the cluster is redundantly stored as the data replicas or erasure-coded segments on a plurality of nodes in the cluster, a number of the data replicas or erasure-coded segments depends on the redundancy policy of the data, and encoding of the data replicas or erasure-coded segments depends on the redundancy policy and erasure-coding algorithm of the data.

3. The distributed shared-nothing storage system of claim 2, wherein:

each node receives a notification of an event, wherein the event is the activation or inactivation of a node or the activation or inactivation of a storage device on any node in the cluster.

4. The distributed shared-nothing storage system of claim 3, wherein:

each event is delivered to each node in the cluster in strict order, the events are uniquely and consistently numbered in a monotonically increasing order, each node is guaranteed to receive all events in the cluster, and each node that has activated after an inactivation is guaranteed to receive all events when it is activated.

5. The distributed shared-nothing storage system of claim 3, wherein:

the state information includes information about a state of the data stored on each node's storage device, and the data replicas or erasure-coded segments on each node's storage device, and a state of the data and the data replicas or erasure-coded segments on the storage devices of all the other nodes in the cluster, wherein:

the state of the data, data replicas or erasure-coded segments comprises:

a DIRTY flag, which is set for the data, data replicas or erasure-coded segments prior to modifying or writing the data, a DEGRADED flag, which is set for the data, data replicas or erasure-coded segments when the nodes are aware that a write or a modification of the data has succeeded on less than all of the data replicas or erasure coded segments, information indicating an event number after which the data was written, and information indicating an event number after which the DEGRADED flag was set, the DIRTY flag is persistent and the DEGRADED flag is persistent, the DIRTY flag is cleared when writes to at least a predetermined quorum of the data replicas or erasure-coded segments of the data have successfully completed, the location of the data and the data replicas or erasure-coded segments is persistently stored or calculated as needed from the location map and metadata of the data, and the metadata includes any of a unique ID, a unique name attribute in a name space of the data, or a description of contents of the data.

6. The distributed shared-nothing storage system of claim 5, wherein:

the event received by each node in the cluster is the activation of a first node or activation of a storage device on the first node, that has been activated subsequent to an inactivation, determination of whether to perform the recovery operation is based on whether any node has any data, data replicas, or erasure-coded segments stored on the first node based on the location map, the first node receives a list of information including the DEGRADED flag, the DIRTY flag, the information indicating the event number of after which the data was written, and the information indicating the event number after which the DEGRADED flag was set, based on the list of information, the first node determines which data, data replica or erasure-coded segment needs to be reconstructed, based on the state information, the first node determines which nodes in the cluster store the data replicas or erasure-coded segments of data on the first node that needs to be reconstructed, to reconstruct the data, data replica or erasure-coded segment on the first node's storage device, the first node requests contents of the data, data replica or erasure-coded segment to be reconstructed, from the nodes in the cluster determined to store the data that needs to be reconstructed, writes the contents of the data to reconstruct and upon completion sends messages to all nodes that sent the list of information, and all nodes in the cluster clear the DEGRADED flag of the data, data replica, or erasure-coded segment if it is determined that all data replicas or erasure-coded segments of the data are recovered on each node in the cluster.

7. A storage system comprising:

a plurality of nodes connected to one or more networks, each node comprising one or more storage devices for storing data and data replicas, wherein:

each node is configured to send and receive input/output (I/O) operations and each node includes location information indicating locations of the data and data replicas stored on the storage devices of the plurality of nodes;

state information, which indicates a status of each node and each storage device on each node, is provided to each node of the plurality of nodes, the state information being updated and changed upon activation or inactivation of a node, or a storage device thereof, based on corresponding activation or inactivation;

based on a change of the state information, in case of the activation including a newly activated node or a node having a newly activated storage device, each node is configured to determine whether to perform a recovery operation to maintain a consistency of the data or data replicas stored on the storage devices of the plurality of nodes; and each node that performs the recovery operation, is configured to perform the recovery operation independently from other nodes to restore the data stored on its one or more storage devices by at least one of sending messages to, or receiving messages from, the other nodes that store affected data.

8. The storage system of claim 7, wherein:
the data is redundantly stored as the data replicas or erasure-coded segments on the plurality of nodes,
a number of the data replicas or erasure-coded segments depends, at least in part, on a redundancy policy of the data, and
encoding of the data replicas or erasure-coded segments depends, at least in part, on the redundancy policy and an erasure-coding algorithm of the data.

9. The storage system of claim 7, wherein:
each node is configured to receive a notification of an event, wherein the event is at least one of:
the activation or inactivation of a node; or
the activation or inactivation of a storage device of a node.

10. The storage system of claim 9, wherein:
each event is delivered to each node in strict order,
the events are numbered in a monotonically increasing order,
each node is guaranteed to receive each of the events, and
each node that has activated after an inactivation is guaranteed to receive each of the events in response to the node being activated.

11. The storage system of claim 9, wherein:
the state information includes information about a state of the data stored on each node's one or more storage devices, and the data replicas or erasure-coded segments on each node's one or more storage devices, and a state of the data and the data replicas or erasure-coded segments on the one or more storage devices of each of the other nodes, wherein:
the state of the data, data replicas or erasure-coded segments comprises:
a DIRTY flag, which is set for the data, data replicas or erasure-coded segments prior to modifying or writing the data,
a DEGRADED flag, which is set for the data, data replicas or erasure-coded segments based on one or more of the nodes determining that a write or a modification of the data has succeeded on less than each of the data replicas or erasure coded segments,
information indicating an event number after which the data was written, and
information indicating an event number after which the DEGRADED flag was set,
the DIRTY flag is persistent and the DEGRADED flag is persistent,
the DIRTY flag is cleared based on writes to at least a predetermined quorum of the data replicas or erasure-coded segments of the data being successfully completed,
the location of the data and data replicas or erasure-coded segments is persistently stored or calculated from the location information and metadata of the data, and
the metadata includes at least one of a unique ID, a unique name attribute in a name space of the data, or a description of contents of the data.

12. The storage system of claim 11, wherein:
the event received by each node is the activation of a first node or activation of a storage device on the first node, that has been activated subsequent to an inactivation,
determination of whether to perform the recovery operation is based at least in part on whether one of the nodes has the data, data replicas, or erasure-coded segments stored on the first node based on the location information,
the first node is configured to receive a list of information including the DEGRADED flag, the DIRTY flag, the information indicating the event number after which the data was written, and the information indicating the event number after which the DEGRADED flag was set,
based on the list of information, the first node determines which of the data, data replica or erasure-coded segment is to be reconstructed,
based on the state information, the first node determines which nodes store the data replicas or erasure-coded segments of the data on the first node that is to be reconstructed, to reconstruct the data, data replica or erasure-coded segment on the first node's one or more storage devices,
the first node is configured to request content of the data, data replica or erasure-coded segment to be reconstructed, from the nodes determined to store the data that is to be reconstructed, write the content of the data to be reconstructed and, upon completion, send messages to each of the plurality of nodes that sent the list of information, and
each of the plurality of nodes is configured to clear the DEGRADED flag of the data, data replica, or erasure-coded segment based at least in part on determining that the data replicas or erasure-coded segments of the data are recovered at each node performing recovery.

13. One or more non-transitory computer readable media with executable instructions stored thereon for execution in a storage system, the storage system including a plurality of nodes connected to one or more networks, each node comprising one or more storage devices for storing data and data replicas, wherein each node is configured to send and receive input/output (I/O) operations and each node includes location information indicating locations of the data and data replicas stored on the storage devices of the plurality of nodes, the executable instructions, when executed, causing one or more of the nodes to perform operations comprising:
providing state information, which indicates a status of each node and each storage device on each node, to each of the plurality of nodes;
updating and changing the state information upon activation or inactivation of a node, or a storage device thereof, based on the corresponding activation or inactivation;
determining, at each node, based at least in part on the activation including a newly activated node or a node having a newly activated storage device, whether to perform a recovery operation to maintain a consistency of the data or data replicas stored on the storage devices of the plurality of nodes based on the change of the state information; and
based at least in part on determining to perform the recovery operation by a respective node, performing the recovery operation, by the respective node, independently from other nodes, to restore the data stored on the one or more storage devices of the respective node by at least one of sending messages to, or receiving messages from, the other nodes that store affected data.

14. The one or more non-transitory computer readable media as recited in claim 13, the operations further comprising:
storing the data redundantly as the data replicas or erasure-coded segments on the storage devices of the plurality of nodes, wherein:

a number of the data replicas or erasure-coded segments depends on a redundancy policy associated with the data; and encoding of replicas or erasure-coded segments depends on the redundancy policy and an erasure-coding algorithm associated with the data.

15. The one or more non-transitory computer readable media as recited in claim 13, the operations further comprising:

receiving, by each node, a notification of an event, wherein the event is the activation or inactivation of a node or the activation or inactivation of a storage device on a node.

16. The one or more non-transitory computer readable media as recited in claim 15, the operations further comprising:

delivering each event to each node in strict order, wherein:
the events are numbered in a monotonically increasing order,
each node is guaranteed to receive each of the events, and
a node that has become activated after an inactivation is guaranteed to receive each of the events in response to activation.

17. The one or more non-transitory computer readable media as recited in claim 15, wherein:

the state information includes information about a state of at least one of the data, data replicas, or erasure-coded segments stored on each node's respective one or more storage devices, the state of at least one of the data, data replicas, or erasure-coded segments on the one or more storage devices of each of the other nodes, wherein:
the state of the at least one of the data, the data replicas, or the erasure-coded segments includes at least one of:
a DIRTY flag, which is set for the data, data replicas or erasure-coded segments prior to modifying or writing the data,
a DEGRADED flag, which is set for the data, data replicas or erasure-coded segments based on one or more of the nodes determining that a write or a modification of the data has succeeded on less than each of the data replicas or erasure coded segments,
information indicating an event number after which the data was written, and
information indicating an event number after which the DEGRADED flag was set,
the DIRTY flag is persistent and the DEGRADED flag is persistent,
the DIRTY flag is cleared based on writes to at least a predetermined quorum of the data replicas or erasure-coded segments of the data being successfully completed,
the location of the data and the data replicas or erasure-coded segments is persistently stored or calculated from the location information and metadata of the data, and
the metadata includes at least one of a unique ID, a unique name attribute in a name space of the data, or a description of contents of the data.

18. The one or more non-transitory computer readable media as recited in claim 17, wherein:

the event received by each node is the activation of a first node or activation of a storage device on the first node, that has been activated subsequent to an inactivation, determination of whether to perform the recovery operation is based at least in part on whether one of the nodes has the data, data replicas, or erasure-coded segments stored on the first node based on the location information, the first node receives a list of information including the DEGRADED flag, the DIRTY flag, the information indicating the event number after which the data was written, and the information indicating the event number after which the DEGRADED flag was set, based on the list of information, the first node determines which data, data replica or erasure-coded segment is to be reconstructed, based on the state information, the first node determines which nodes store the data replicas or erasure-coded segments of the data on the first node that is to be reconstructed, to reconstruct the data, data replica or erasure-coded segment on the first node's one or more storage devices, the first node requests content of the data, data replica or erasure-coded segment to be reconstructed, from at least one of the nodes determined to store the data that is to be reconstructed, writes the content of the data to be reconstructed and, upon completion, sends messages to each of the plurality of nodes that sent the list of information, and each of the plurality of nodes clears the DEGRADED flag of the data, data replica, or erasure-coded segment based at least in part on determining that the data replicas or erasure-coded segments of the data are recovered at each node performing recovery.

19. A method performed by one or more nodes of a storage system, the storage system including a plurality of the nodes connected to one or more networks, each node comprising one or more storage devices for storing data and data replicas, wherein each node is configured to send and receive input/output (I/O) operations and each node includes location information indicating locations of the data and data replicas stored on the storage devices of the plurality of nodes, the method comprising:

providing state information, which indicates a status of each node and each storage device on each node, to each of the plurality of nodes;

updating and changing the state information upon activation or inactivation of a node, or a storage device thereof, based on the corresponding activation or inactivation;

determining, at each node, based at least in part on the activation including a newly activated node or a node having a newly activated storage device, whether to perform a recovery operation to maintain a consistency of the data or data replicas stored on the storage devices of the plurality of nodes based on the change of the state information; and based at least in part on determining to perform the recovery operation by a respective node, performing the recovery operation, by the respective node, independently from other nodes, to restore the data stored on the one or more storage devices of the respective node by at least one of sending messages to, or receiving messages from, the other nodes that store affected data.

20. The method as recited in claim 19, further comprising:

storing the data redundantly as the data replicas or erasure-coded segments on the storage devices of the plurality of nodes, wherein:
a number of the data replicas or erasure-coded segments depends on a redundancy policy associated with the data; and encoding of replicas or erasure-coded segments depends on the redundancy policy and an erasure-coding algorithm associated with the data.

21. The method as recited in claim 19, further comprising:

receiving, by each node, a notification of an event, wherein the event is the activation or inactivation of a node or the activation or inactivation of a storage device on a node.

22. The method as recited in claim 21, further comprising:

delivering each event to each node in strict order, wherein:
- the events are numbered in a monotonically increasing order,
- each node is guaranteed to receive each of the events, and
- a node that has become activated after an inactivation is guaranteed to receive each of the events in response to activation.

23. The method as recited in claim 21, wherein:

the state information includes information about a state of at least one of the data, data replicas, or erasure-coded segments stored on each node's respective one or more storage devices, the state of at least one of the data, data replicas, or erasure-coded segments on the one or more storage devices of each of the other nodes, wherein:
- the state of the at least one of the data, the data replicas, or the erasure-coded segments includes at least one of:
  - a DIRTY flag, which is set for the data, data replicas or erasure-coded segments prior to modifying or writing the data,
  - a DEGRADED flag, which is set for the data, data replicas or erasure-coded segments based on one or more of the nodes determining that a write or a modification of the data has succeeded on less than each of the data replicas or erasure coded segments,
  - information indicating an event number after which the data was written, and
  - information indicating an event number after which the DEGRADED flag was set,
- the DIRTY flag is persistent and the DEGRADED flag is persistent,
- the DIRTY flag is cleared based on writes to at least a predetermined quorum of the data replicas or erasure-coded segments of the data being successfully completed, the location of the data and the data replicas or erasure-coded segments is persistently stored or calculated from the location information and metadata of the data, and the metadata includes at least one of a unique ID, a unique name attribute in a name space of the data, or a description of contents of the data.

24. The method as recited in claim 23, wherein:

the event received by each node is the activation of a first node or activation of a storage device on the first node, that has been activated subsequent to an inactivation, determination of whether to perform the recovery operation is based at least in part on whether one of the nodes has the data, data replicas, or erasure-coded segments stored on the first node based on the location information, the first node receives a list of information including the DEGRADED flag, the DIRTY flag, the information indicating the event number after which the data was written, and the information indicating the event number after which the DEGRADED flag was set, based on the list of information, the first node determines which data, data replica or erasure-coded segment is to be reconstructed, based on the state information, the first node determines which nodes store the data replicas or erasure-coded segments of the data on the first node that is to be reconstructed, to reconstruct the data, data replica or erasure-coded segment on the first node's one or more storage devices, the first node requests content of the data, data replica or erasure-coded segment to be reconstructed, from at least one of the nodes determined to store the data that is to be reconstructed, writes the content of the data to be reconstructed and, upon completion, sends messages to each of the plurality of nodes that sent the list of information, and each of the plurality of nodes clears the DEGRADED flag of the data, data replica, or erasure-coded segment based at least in part on determining that the data replicas or erasure-coded segments of the data are recovered at each node performing recovery.

\* \* \* \* \*